(12) United States Patent
Ricketts et al.

(10) Patent No.: US 7,339,440 B2
(45) Date of Patent: Mar. 4, 2008

(54) NONLINEAR PULSE OSCILLATOR METHODS AND APPARATUS

(75) Inventors: David Ricketts, Warwick, RI (US); Xiaofeng Li, Henan (CN); Donhee Ham, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 68 days.

(21) Appl. No.: 11/222,255

(22) Filed: Sep. 8, 2005

(65) Prior Publication Data

US 2006/0114550 A1 Jun. 1, 2006

Related U.S. Application Data

(60) Provisional application No. 60/631,682, filed on Nov. 30, 2004.

(51) Int. Cl.
*H03B 5/08* (2006.01)
(52) U.S. Cl. .................. 331/107 SL; 331/107 DP; 331/173; 331/103; 331/106
(58) Field of Classification Search .......... 331/107 SL, 331/107 DP, 173, 103, 106
See application file for complete search history.

(56) References Cited

U.S. PATENT DOCUMENTS 3,319,187 A 5/1967 Crandall

| | | | |
|---|---|---|---|
| 5,352,994 A | 10/1994 | Black et al. | |
| 6,847,758 B1 | 1/2005 | Watanabe | |
| 6,900,710 B2 | 5/2005 | Agoston et al. | |
| 2005/0146386 A1 | 7/2005 | Frazier | |

OTHER PUBLICATIONS

Ballantyne et al., "A Baseband Soliton Oscillator," *Chaos, Solitons & Fractals*, vol. 5, No. 6, pp. 1013-1029, Jun. 1995.

(Continued)

*Primary Examiner*—Arnold Kinkead
(74) *Attorney, Agent, or Firm*—Wolf, Greenfield & Sacks, P.C.

(57) ABSTRACT

Methods and apparatus for implementing stable self-starting and self-sustaining electrical nonlinear pulse (e.g., soliton, cnoidal wave, or quasi-soliton) oscillators. In one example, a nonlinear pulse oscillator is implemented as a closed loop structure that comprises a nonlinear transmission line, an improved high-pass filter, and a nonlinear amplifier configured to provide a self-adjusting gain as a function of an average voltage of the oscillator signal, to provide a pulse waveform having a desired target amplitude. In one implementation, the nonlinear amplifier and high pass filter functions are integrated in a two stage nonlinear amplifier/filter apparatus employing complimentary NMOS and PMOS amplification components and associated filtering and feedback circuitry configured to essentially implement an electric circuit analog of a saturable absorber via an adaptive bias control technique.

35 Claims, 17 Drawing Sheets

OTHER PUBLICATIONS

Kalinikos et al., "Decay Free Microwave Magnetic Envelope Soliton Pulse Trains in Yttrium Iron Garnet Thin Films," *Physical Review Letters*, vol. 78, No. 14, Apr. 7, 1997.

Ballantyne, G. J., et al.; "Periodic Solutions of Toda Lattice in Loop Nonlinear Transmission Line"; Electronics Letters Apr. 1, 1993; vol. 29, No. 7; pp. 607-609.

Ballantyne, Gary J.; "Periodically Amplified Soliton Systems"; Thesis Presented for the degree of Doctor of Philosophy in Electrical and Electronic Engineering at the University of Canterbury, Christchurch, New Zealand; Oct. 1994.

Cutler, C. C.; "The Regenerative Pulse Generator"; Proceedings of the IRE; Feb. 1955; pp. 140-148.

Remoissenet, Michel; "Waves Called Solitons Concepts and Experiments"; 3$^{rd}$ Edition Springer-Verlag Berlin Heidelberg New York (1999).

NONLINEAR PULSE OSCILLATOR METHODS AND APPARATUS

CROSS-REFERENCES TO RELATED APPLICATION(S)

The present application claims the benefit, under 35 U.S.C. § 119(e), of U.S. Provisional Application Ser. No. 60/631,682, filed Nov. 30, 2004, entitled "Nonlinear Pulse Oscillator Methods and Apparatus," which application hereby is incorporated by reference herein.

GOVERNMENT SPONSORED RESEARCH

Some of the research relating to the subject matter disclosed herein was sponsored by NSF ITR government grant ECS-0313143, and the government has certain rights to some disclosed subject matter.

FIELD OF THE DISCLOSURE

The present disclosure relates generally to nonlinear pulse oscillators and, more particularly, various examples of self-starting and self-sustaining electrical soliton and quasi-soliton oscillator methods and apparatus employing nonlinear transmission lines and spectrum-preserving nonlinear amplification.

BACKGROUND

Conventional traveling wave oscillators, employed in many electronics applications requiring high-speed clock signals (e.g., on the order of several gigahertz), are linear systems that generally employ a linear transmission line over which sinusoidal waves of a particular frequency are propagated. In such systems, linear amplifiers are employed to overcome resistive losses present in the transmission line so as to maintain the signal strength of the traveling sinusoidal wave and permit oscillation. While such linear oscillator systems have found application in the area of high-speed electronics, for example, ongoing research in nonlinear systems has raised interest in the practical merits of such systems as an alternative to linear systems, and possible applications for non-sinusoidal waveforms traveling in nonlinear media.

It is generally appreciated in mathematics and the physical sciences that any arbitrary non-sinusoidal waveform in space and/or time may be represented by multiple sinusoidal waveforms of varying frequencies, amplitudes and phases superimposed upon one another. This idea of a given waveform having multiple different-frequency sinusoidal components, commonly referred to as a Fourier spectrum, has interesting implications for non-sinusoidal waveforms that travel over some distance from one point to another via some medium.

In particular, an arbitrary waveform traveling through a medium may or may not be significantly affected or altered (e.g., distorted in shape) by the medium, depending on how the waveform's constituent sinusoidal components are affected by the medium. The medium of a perfect vacuum may be viewed as a sort of reference point for waveform propagation; in the medium of a perfect vacuum, often referred to as "free space," it is generally presumed that an arbitrary waveform is not significantly affected while traveling through free space, as there is theoretically no material in the medium of the vacuum to somehow affect or impede the propagation of the sinusoidal components making up the waveform. Accordingly, when sinusoidal waves travel through a medium other than free space, they propagate more slowly than they would in a theoretical vacuum, as the material making up the medium through which the waves travel somehow affects or impedes the propagation of the waves.

The speed of a given sinusoidal component traveling through some medium is commonly referred to as the "phase velocity" of the component (often denoted as $v_p$), and is generally related to various physical properties of the material that makes up the medium. For each sinusoidal component of a waveform, the phase velocity of that component is given as $v_p = f\lambda$, where f is the frequency of the component and $\lambda$ is the wavelength of the component.

Various media that are encountered in practical applications involving waveform propagation may be generally characterized by two noteworthy properties of the medium that may affect waveform propagation. One of these properties is conventionally referred to as "dispersion" and another of these properties is conventionally referred to as "nonlinearity." In a medium with significant dispersive properties, the frequency of a given sinusoidal waveform may affect the speed with which it travels through the medium. On the other hand, in a medium with significant nonlinear properties, the velocity of the waveform differs for each point on the waveform, usually depending on the amplitude of the point. In general, various media may possess some degree of both dispersive and nonlinear properties; in practical applications, one or both of these properties may or may not present a significant issue with respect to waveform distortion.

For example, if a medium does not have significant dispersive properties for a given application (i.e., a "non-dispersive" medium for a particular frequency range), essentially all sinusoidal waves having frequencies within a particular range travel through the medium at essentially the same speed. Thus, in a non-dispersive medium, an arbitrary waveform traveling through the medium theoretically maintains its shape, as all of the constituent sinusoidal components making up the waveform travel together at the same speed. Again, one common example of a non-dispersive medium is a theoretical vacuum or "free space," as discussed above.

In contrast to a non-dispersive medium, a dispersive medium is one in which the properties of the medium that determine phase velocity $v_p$ depend on frequency $f$. Stated differently, the phase velocity of a given frequency component is a function of the frequency of that component and, as a result, different frequencies travel at different speeds through the dispersive medium. This situation may significantly affect an arbitrary waveform traveling through the dispersive medium; namely, the different sinusoidal frequency components making up the waveform travel at respectively different speeds and "spread out" from one another, which inevitably leads to distortion (e.g., broadening) of the waveform. This condition is referred to as "dispersion," and is observed to various extents in many real-world situations involving waveforms traveling through media. Some common examples of dispersion include the spreading out of waves created by a drop of water onto a pond, as well as waveform distortion in electronic or optical communications (in which electrical signals travel significant distances through conductive or semiconductive material, or light travels significant distances through optical fibers).

As discussed above, not only may the frequency of a given sinusoidal component affect the speed with which it travels through a medium, but in some media the amplitude or "strength" of the component also may affect the speed with which each point on a waveform travels. One example of a nonlinear medium is given by waves in shallow water (e.g., consider the ocean near a beach). As the waves approach the beach they are initially symmetric. As they get closer to the shoreline, however, the peaks travel faster than the troughs due to the nonlinearity in water, thus causing the front face to steepen. Eventually this slope becomes too great for the wave and it breaks.

While either dispersion or nonlinearity each can lead to significant distortion of an arbitrary waveform propagating in a given medium, in some instances a medium may have both dispersive and nonlinear qualities, i.e., both the frequency and amplitude of a waveform may affect the speed with which it travels through the medium. In one sense, this may be viewed as a somewhat chaotic circumstance for an arbitrary waveform traveling through the medium; more specifically, it should be appreciated that an arbitrary waveform propagating through a dispersive and nonlinear medium very likely would quickly distort and ultimately "disappear," as its constituent sinusoidal components seemingly travel randomly at different speeds based on their respective frequencies and/or amplitudes.

However, if certain conditions are fulfilled, namely, if there is a very particular balance between the effects of dispersion (which tend to spread out or broaden a waveform) versus the effects of nonlinearity (which in some instances tends to "bunch up" or squeeze together different frequency components of a waveform), the unexpected may happen; a particularly shaped waveform may be excited in the dispersive nonlinear medium and propagate through the medium without distortion. Such a remarkable waveform that exploits a precise dynamic balance between dispersion and nonlinearity to maintain its shape is called a "soliton."

A soliton waveform refers to a bell-shaped pulse that propagates by itself in a dispersive nonlinear medium without changing its shape. This solitary wave also can survive collisions with other solitary waves without altering its speed or shape, in a manner similar to that of classical particles such as electrons and protons; hence the name "soliton," i.e., a solitary wave which behaves like a classical particle (e.g., electron or proton). The first observation of a soliton was made by John Scott Russel in 1838 when he noted an unusually persistent water wave traveling an appreciable distance down a barge canal without changing its shape. Many years later, Russel's observation was given a theoretical framework by the Dutch mathematicians D. J. Korteweg and G. de Vries, who derived arguably the most famous of all nonlinear equations (referred to as the KdV equation) to describe the interaction of dispersion and nonlinearity that gives rise to the existence of a soliton waveform.

In particular, the KdV equation describes the behavior of a waveform in space and time in the presence of dispersion and nonlinearity. If the shape or profile of the waveform (i.e., its "height") at a given point z in space, and at a given time t, is denoted as u (z, t), a general form for the KdV equation is given by:

$$\frac{\partial u}{\partial t} + 6u\frac{\partial u}{\partial z} + \frac{\partial^3 u}{\partial z^3} = 0. \qquad (1)$$

The first term of Eq. (1) signifies that it is a first order evolution equation in time (i.e., a determination of what happens to the overall profile or shape of the waveform over time). The second term of Eq. (1) accounts for nonlinearity and is amplitude dependent (as evidenced by the factor u multiplying the first order partial derivative with respect to space z), while the third term accounts for dispersion. Arbitrary coefficients for these terms can be arranged by rescaling the dependent and independent variables.

The soliton solution to Eq. (1) is given by:

$$u(z, t) = A \operatorname{sech}^2 \sqrt{\frac{A}{2}} (z - 2At), \qquad (2)$$

which is a smooth bell-shaped pulse that completely depends on the parameter A (which represents the maximum amplitude of the pulse). Again, Eq. (2) represents the evolution of a snapshot of a soliton waveform taken at one time to another snapshot at some later time (it should be appreciated that a valid description also may be maintained by evolving a function of time in the spatial variable z, in which case the roles of the independent variable z and t in Eq. (1) are reversed).

Eq. (2) describes a family of soliton solutions, all determined by the parameter A. FIG. 1 shows two examples of solitons described by Eq. (2). As the nonlinearity in the medium of propagation depends on the amplitude of the soliton waveform, and the dispersion in the medium depends on the width (i.e., the frequency content) of the soliton waveform, it should be appreciated that more than one combination of width and amplitude can satisfy the balance needed for a soliton; hence, taller solitons are relatively narrow (larger A), whereas as shorter solitons are relatively broader (smaller A), as illustrated in FIG. 1. Additionally, it may be noted from Eq. (2) that the speed of a soliton is dependent on the pulse amplitude A, such that taller solitons (larger A) travel more quickly than shorter solitons. In sum, the height, width and speed of KdV solitons are all interrelated, in that a soliton of a specific amplitude has a specific width and travels at a specific speed.

In the physical sciences, solitons have generated significant interest for practical applications in the areas of hydrodynamics, chemistry, plasma physics, optical communications, information encoding and decoding, pulsed power technology, spectroscopy, and neural networks. Generally speaking, any application that may utilize or require sharp reproducible pulses may implicate the generation and propagation of solitons.

In addition to solitons, the KdV equation has a periodic solution, often referred to as "cnoidal" waves, which essentially are constructed from a nonlinear sum of translated soliton solutions. Accordingly, in one sense, a cnoidal wave may be viewed figuratively as a train of soliton pulses all propagating at the same speed at some fixed distance from one another.

In practical applications involving soliton (or cnoidal wave) propagation through some medium, features other than dispersion and nonlinearity often must be considered. Perhaps the most common is attenuation, or loss of signal power as the soliton propagates in the medium, due to dissipative (resistive) properties of the medium. These dissipative properties may be linear or nonlinear, as well as frequency dependent or independent. Also, perturbations to the system or inhomogeneities in the system in which a soliton propagates also may need to be accounted for. Accordingly, a general modification to the KdV equation may be made to account for features such as attenuation, perturbation and/or inhomogeneity by adding a term P(u) to the right hand side of Eq. (1):

$$\frac{\partial u}{\partial t} + u\frac{\partial u}{\partial z} + \frac{\partial^3 u}{\partial z^3} = P(u).$$

Generally speaking, the evolution of an initial condition (e.g., an arbitrary waveform, perturbation, disturbance, noise, etc.) in a dispersive nonlinear system described by the KdV equation can be broken down into two categories, namely, parts which develop into solitons as described by Eq. (2) above, and those which do not (often referred to as a dispersive wave or radiation). In many applications, the dispersive wave or radiation can be treated as a transient, because it eventually dies away, while the soliton(s) remain intact. It is a remarkable feature of the KdV equation that almost every reasonably shaped initial condition develops into one or more solitons; in this sense, solitons have a surprisingly natural stability and robustness to noise in the face of chaotic conditions presented by a nonlinear system. If an initial condition is such that multiple solitons evolve, they will eventually separate because, as discussed above, solitons of different amplitudes travel at different speeds (i.e., higher amplitude solitons travel relatively faster).

Solitons (or cnoidal waves), or nonlinear pulses that closely resemble pure solitons (i.e., "quasi-soliton" pulses) are known to propagate in the medium of a nonlinear transmission line, which may be described by the KdV equation. For the following discussions, the terms "soliton" or "solitons" refer not only to pure soliton waveforms or cnoidal waves, but also are intended to encompass nonlinear pulses that may not have exactly a soliton waveform, but significantly resemble solitons and behave effectively like solitons in a given environment.

Many experiments on soliton propagation have been conducted using nonlinear transmission lines constructed from lumped components and implemented as a "lattice," an example of which is illustrated in FIG. 2. The nonlinear transmission line lattice 30 shown in FIG. 2 includes a number of inductors 32 each having an inductance L and a number of varactor diodes 34 arranged in a reverse-biased configuration to provide a voltage-dependent capacitance C(V); in particular, the capacitance of the varactor diodes 34 increases as the voltage V across the diodes decreases, according to a nonlinear relationship which may be approximated by:

$$C(V) = \frac{Q_0}{F_o - V - V_0}, \quad (3)$$

where $F_o$ and $Q_o$ are parameters that describe the nonlinearity and $V_o$ is a reverse DC bias voltage applied across the varactor diodes, in addition to the signal voltage V, to provide for minor adjustments in the nonlinear response of the diodes. Hence, the nonlinearity of the lattice 30 is attributed to the nonlinear voltage-dependent capacitance C(V) provided by reverse-biased varactor diodes 34, whereas the overall lattice-like arrangement of lumped components (in essence acting like a multiple-order filter) provides the dispersion to balance the nonlinearity in the case of a soliton waveform.

With the appropriate nonlinear characteristic, the lumped nonlinear transmission line is equivalent to what is conventionally known in particle physics as a "Toda Lattice," which models nonlinear potentials between particles. The Toda Lattice may be closely approximated by the KdV equation and thus has soliton and cnoidal solutions. For this reason, the lumped nonlinear transmission line has received considerable attention for studying solitons.

The inductors and varactor diodes in the lattice of FIG. 2 are illustrated as "ideal" inductive and capacitive components. In practical implementations, however, the physical structure of these components results in non-ideal behavior that must be appropriately modeled. For example, a realistic model for the inductors 32 must include the effects of a series-resistance of the inductor winding, as well as inter-winding capacitance and high frequency parallel resistive losses. In particular, the inductor winding resistance is generally considered to most significantly contribute to signal power loss on the nonlinear transmission line (i.e., signal attenuation), whereas inter-winding capacitance contributes to dispersion. Likewise, non-ideal behavior in the varactor diodes 34 may be appropriately modeled by considering a series-resistance with the diode, which further contributes to high frequency losses and overall signal attenuation with propagation along the lattice 30.

In some early research regarding soliton propagation on a nonlinear transmission line, a loop of nonlinear transmission line was employed to increase the apparent length of the transmission line so as to analyze soliton propagation over significant distances (e.g., see Michel Remoissenet, "Waves Called Solitons, Concepts and Experiments," Third Edition, Springer-Verlag, 1999, ISBN 3-540-65919-6, hereby incorporated herein by reference). FIG. 3 illustrates a diagram of such an apparatus, employing two switches 36, a pulse generator/switch driver 38, and a nonlinear transmission line 30. For simplicity, the varactor diodes 34 of the transmission line are represented in FIG. 3 as variable capacitors. In the arrangement of FIG. 3, the switches 36 first are placed in their upper positions, such that one end of the nonlinear transmission line is coupled to an output of the pulse generator 38, while another end of the transmission line is terminated with a resistance $R_L$. The pulse generator outputs a pulse having an arbitrary waveform which, due to a balance between dispersion and nonlinearity presented by the nonlinear transmission line, evolves into a soliton. If the switches are then placed in their lower positions, the opposite ends of the transmission line are coupled together to form a closed loop, which permits the soliton to circulate in the loop (as if traveling along a significant length of nonlinear transmission line). Due to signal attenuation resulting from the resistive losses inherent in the nonlinear transmission line, the amplitude of the circulating soliton gradually decreases (while the width of the soliton correspondingly increases), until eventually the soliton dies out.

In subsequent research, in an attempt to overcome losses in the medium, an amplifier was employed with a loop of nonlinear transmission line to implement a soliton oscillator. The addition of the amplifier permitted a theoretically self-sustaining device in which a soliton could conceivably circulate endlessly in the loop of nonlinear transmission line (e.g., see Ballantyne et al., "Periodic Solutions of Toda Lattice in Loop Nonlinear Transmission Line," Electronics Letters, Vol. 29, No. 7, Apr. 1, 1993, pp. 607-609 and Ballantyne, Gary J., "Periodically Amplified Soliton Systems," Doctoral Thesis in Electrical and Electronic Engineering at the University of Canterbury, Christchurch, New Zealand, both of which disclosures are incorporated herein by reference). Such an oscillator based on a nonlinear transmission line may be effectively modeled as a Toda Lattice, as discussed above. In such a device, there are four mechanisms operating to produce a soliton oscillation, namely, dispersion, nonlinearity, attenuation and amplification. A steady state is reached when the circuit achieves a balance amongst all four of these mechanisms.

FIG. 4 illustrates such an arrangement, in which a section of nonlinear transmission line 30A (including the inductors 32 and varactor diodes 34) is "tapped" and coupled via a first buffer 58A to a high pass filter 50, and then via a second buffer 58B to a conventional linear amplifier 52. A power supply 56 provides a DC bias voltage for the circuit, so as to appropriately reverse-bias the varactor diodes 34 at some predetermined operating point along a characteristic capacitance/voltage curve for these devices (e.g., see the parameter $V_o$ of Eq. (3) above). The output of the linear amplifier 52 drives the section of nonlinear transmission line 30A to complete the loop. In the desired operation mode, the gain of the linear amplifier is carefully adjusted (via variable resistor 60) to precisely compensate for losses in the circuit, so as to create the appropriate conditions for soliton propagation in the loop.

FIG. 5 illustrates three examples of waveforms observed in the oscillator, each representing a soliton circulating repeatedly around the loop given a particular amplifier gain setting. As discussed further below, for some particular range of amplifier gains, a relatively lower gain corresponds to a lower pulse amplitude (e.g., uppermost plot in FIG. 5), whereas a relatively higher gain corresponds to a higher pulse amplitude (e.g., lowermost plot in FIG. 5). An output of the oscillator circuit may be taken at the point 64 indicated in FIG. 4 (at the output of the first buffer 58A), although theoretically the circulating soliton pulses may be observed at any point in the circuit. It should be appreciated that in the circuit of FIG. 4, the first buffer 58A provides required isolation between the high pass filter 50 and the line 30 (so that the filter does not unduly load the line), whereas the second buffer 58B provides required isolation between the high pass filter 50 and the amplifier 52 (so that the gain adjustment resistors of the amplifier do not unduly load the high pass filter).

In the circuit of FIG. 4, so as to prevent reflections and maintain unidirectional operation of the oscillator, a termination 54 is employed on the nonlinear transmission line to approximate a matched load for the line. An exact match is not practically possible because the transmission line is nonlinear and dispersive and does not have a constant characteristic impedance. In particular, in the case of a linear dispersionless transmission line, the line could be perfectly terminated with its characteristic impedance $$Z_o = \sqrt{\frac{L}{C}},$$

so that each frequency is perfectly absorbed by the resistive termination. In the case of a lumped "LC" transmission line, dispersion dictates that this can only be achieved at one frequency. If the transmission line further is nonlinear, as in the example of FIG. 4, the termination theoretically also should be nonlinear, which is difficult to practically implement.

Accordingly, as a reasonable approximation, a nominal characteristic impedance $\zeta_o$ is selected for the termination 54 based on the nominal capacitance of the varactor diodes at zero volts $$\left(\text{i.e., } \zeta_o = \sqrt{\frac{L}{C(0)}}\right).$$

A small blocking capacitor $C_b$ is also employed to prevent a voltage divider forming for DC voltages between the transmission line series resistance and the nominal termination resistance $\zeta_o$. Hence, the relatively simple termination 54 shown in FIG. 4 cannot provide a perfect match, but is nonetheless sufficient at allowing some soliton oscillations to exist on the loop for an observable period of time.

The filter 50 of the circuit shown in FIG. 4 is a simple high-pass filter to inhibit low frequency instability. In particular, because of the positive feedback arrangement of the loop provided by the non-inverting linear amplifier 52 (discussed further below), the filter is required to block the DC bias voltage provided across the nonlinear transmission line by the power supply 56. Without the filter 50, the oscillator sits at the upper DC supply rail of the amplifier when the gain is increased beyond some critical value. Beyond this requirement, the filter cut-off frequency is arbitrarily selected to be low enough so as not to hinder operation of the oscillator (i.e., so as to pass the frequency content of signals that may be supported by the oscillator). Generally speaking, the frequencies supported by the oscillator circuit of FIG. 4 (i.e., the pulse repetition rate, or distance between consecutive soliton pulses) are determined by the inductance values L, range of values for the variable capacitances C(V) and the number of nodes or sections of the nonlinear transmission line 30A over which the soliton travels before the line is tapped and fed back to the high-pass filter 50.

As discussed above, the role of the linear amplifier 52 in the circuit of FIG. 4 is to compensate for transmission line losses and overcome attenuation of a soliton as it propagates around the circuit loop. As can be readily observed in FIG. 4, the amplifier is implemented as a conventional non-inverting linear amplifier whose gain is manually adjustable via the variable resistor 60. Soliton oscillation is initiated by increasing the gain to some critical value which is sufficient to overcome losses in the circuit. Beyond this critical gain, one or more solitons begin circulating in the loop. This implies that a noisy initial state is fashioned into one or more steady state waveforms after successive passes around the loop. In essence, the nonlinear transmission line recursively fashions noise into a shape that can traverse the circuit and be re-amplified back to a sustainable form—in particular, soliton solutions that closely resemble those of the KdV equation discussed above.

Just beyond the critical gain to begin oscillation, further adjustments to the gain of the linear amplifier 52 affect the amplitude of a given soliton generated in the circuit of FIG. 4, as discussed above. In particular, a small gain just above the critical gain produces a relatively smaller amplitude soliton, whereas a larger gain produces a relatively larger amplitude soliton (recall that Eq. (2) above represents a family of solutions with different amplitudes A, wherein the width of the soliton pulse decreases with increasing amplitude and larger amplitude pulses travel faster than smaller amplitude pulses). FIG. 5 illustrates the effect of varying the amplifier gain in the circuit of FIG. 4 just above the critical gain, wherein the uppermost plot represents relatively smaller gain and the lowermost plot represents relatively larger gain. It may be readily observed in FIG. 5 that the soliton width decreases with increasing gain, as expected based on Eq. (2) above.

One problem with the linear amplification scheme in the circuit of FIG. 4 is that the circuit is extremely sensitive to gain adjustments; in particular, the change in gain necessary to overcome losses and generate some steady state soliton oscillation is a few percent at most, and more typically less than one percent. This situation makes it extremely difficult to manually adjust the amplifier gain to precisely those values that permit a desired oscillation. For purposes of illustration, this type of gain adjustment is somewhat like trying to balance a ball on the tip of a pencil, in which a small deviation from the precise balance of forces (e.g., a small disturbance) causes the ball to fall.

In an attempt to lower the sensitivity of amplifier gain adjustment, additional resistive losses are deliberately introduced in the circuit of FIG. 4, in the form of resistors 62 disposed in both the series and shunt branches of the nonlinear transmission line 30A. In the foregoing illustration of a ball balanced on a pencil tip, the deliberate introduction of additional resistive losses is akin to dulling the point of the pencil on which the ball is balanced. These additional losses intentionally introduced in the nonlinear transmission line are required to allow any practical adjustment of the amplifier gain in the circuit of FIG. 4. At the same time, the resistors 62 in the nonlinear transmission line 30A constitute a noteworthy difference from the conventional nonlinear transmission line 30 illustrated in FIGS. 2 and 3, in which losses in the line are attributed primarily to the naturally occurring non-ideal resistive properties of the inductor and varactor diode components. Hence, the addition of the resistors 62 is somewhat of a peculiar departure from the conventional nonlinear transmission line configuration, inasmuch as the line must be made more lossy to facilitate proper operation of the circuit.

It should be appreciated, however, that notwithstanding the intentional addition of extra losses in the circuit, the manual amplifier gain adjustment in the circuit of FIG. 4 is still significantly sensitive. Specifically, in the exemplary waveforms shown in FIG. 5, the amplifier gains that generate the three waveforms are, from top to bottom, 1.092, 1.100 and 1.109, respectively, demonstrating appreciably small differences in gain of less than one percent for corresponding significant differences (e.g., approximately doubling) in pulse amplitude. Again, this situation makes it extremely difficult to manually adjust the amplifier gain to permit a desired oscillation.

Another problematic issue in the circuit of FIG. 4 is that when the gain is further increased beyond the critical value to initiate soliton oscillation, multiple solitons having different amplitudes may be generated. Again, due to the sensitivity of the amplifier gain adjustment, this condition is easily achieved whether or not it is desired; in particular, even if the gain is carefully adjusted initially to permit oscillation of a single soliton having a particular amplitude, system conditions (e.g., filter cutoff frequency) may be such that an external perturbation (e.g., noise) begins circulating in the circuit and is amplified to create one or more additional solitons.

Because of the different amplitudes of the multiple solitons thusly generated, each soliton travels at a different speed and multiple solitons eventually collide with one another in the oscillator circuit of FIG. 4. As discussed above, an interesting characteristic of solitons is that they survive collisions without altering their speed or shape; hence the multiple different-amplitude solitons continue to circulate and collide periodically. FIG. 6 illustrates a collision 66 of two solitons, as a larger amplitude pulse 68 overtakes and collides with a smaller amplitude pulse 70. It should be appreciated that for applications in which a stable and predictable oscillator is desired, collisions of multiple solitons may represent a notably undesirable condition.

In sum, the circuit of FIG. 4 is characterized by a significantly sensitive manual amplifier gain adjustment and somewhat unpredictable multiple-mode operation in which soliton collisions may readily occur. Hence, although the circuit of FIG. 4 provides an interesting laboratory curiosity for research purposes, this type of soliton oscillator implementation is arguably not well-suited for practical applications that require stable single-mode oscillation.

SUMMARY

In view of the foregoing, the present disclosure is directed generally to various improved methods and apparatus for implementing stable self-starting and self-sustaining nonlinear pulse (e.g., soliton, cnoidal wave, or quasi-soliton) oscillators. For example, in one embodiment, a nonlinear pulse oscillator is implemented as a closed loop structure that comprises a nonlinear transmission line, a high-pass filter, and a nonlinear amplifier configured to provide a self-adjusting gain as a function of the average voltage of the oscillator signal (i.e., the propagating pulses).

In particular, in one aspect of this embodiment, the nonlinear amplifier is configured to provide relatively higher gain for oscillator signals having lower average voltages, and gradually decreasing gain to a unity gain at some predetermined "crossover" average voltage corresponding to a desired nonlinear pulse amplitude. As the average voltage of the oscillator signal is increased beyond this crossover voltage, the nonlinear amplifier is configured to provide attenuation, such that the average gain for the steady state oscillator signal is unity. For purposes of illustration, this nonlinear gain functionality of an amplifier according to various embodiments of the present disclosure is akin to the situation of a ball sitting in the bottom of a bowl, as opposed to balancing the ball on the tip of a pencil, as in a linear amplifier; in the former case, the ball tends easily to stay at the bottom of the bowl notwithstanding perturbations to the bowl, whereas in the latter case, extreme care must be taken to keep the ball balanced on the tip of the pencil, especially in response to disturbances.

In another aspect, an adaptive bias control technique is employed together with the nonlinear gain functionality to ensure robust, stable operation of the oscillator. The implementation of a nonlinear amplifier with adaptive bias control according to various embodiments of the present disclosure may be viewed conceptually as an electric circuit analog of a saturable absorber, which is configured to effectively reduce distortion to pulses propagating in the oscillator, reject perturbations to the system, and ensure the selection and propagation of a single mode.

In yet another aspect, one or more high pass filters employed in the oscillator may be particularly configured to facilitate single mode operation. For example, according to one embodiment, the cut-off frequency of one or more high pass filters is particularly selected so as to prohibit collisions of multiple different-amplitude nonlinear pulses. The filter design according to this embodiment takes advantage of the fact that collisions of multiple different-amplitude solitons or quasi-solitons tend to skew the frequency spectrum of the oscillator toward higher power at lower frequencies (i.e., energy is transferred from higher frequency spectrum components to lower frequency spectrum components). Accordingly, by designing the high pass filter to appropriately attenuate lower frequency spectrum components characteristic of soliton collisions, such collisions are effectively precluded from forming in the oscillator.

Improved nonlinear pulse oscillator methods and apparatus according to the present disclosure may be employed in any one of a number of applications in the areas of high-speed electronics, electrical and optical communication systems, information encoding and decoding, pulsed power technology, spectroscopy, and neural networks. Generally speaking, any application that requires sharp reproducible pulses may implicate the generation and propagation of nonlinear pulses via the improved methods and apparatus disclosed herein.

In sum, one embodiment according to the present disclosure is directed to an electrical nonlinear pulse oscillator, comprising a nonlinear transmission line and a nonlinear amplifier coupled to the nonlinear transmission line in a closed loop arrangement. In this embodiment, the oscillator is configured to propagate along the nonlinear transmission line at least one nonlinear pulse having a target amplitude.

Another embodiment according to the present disclosure is directed to a method for generating periodic electrical nonlinear pulses, comprising acts of: A) amplifying or attenuating a first signal in a nonlinear manner to provide a second signal; B) applying the second signal to a nonlinear transmission line for propagation along the nonlinear transmission line to generate a third signal; C) repeating the acts A) and B) using the third signal as the first signal; and D) repeating the acts A), B) and C) such that the third signal develops the periodic nonlinear pulses having a target amplitude.

Another embodiment according to the present disclosure is directed to a nonlinear amplifier, comprising a first stage including at least one first semiconductor amplifying component and first feedback circuitry to facilitate a variable adjustment of a first bias voltage associated with the at least one first semiconductor amplifying component, and a second stage including at least one second semiconductor amplifying component and second feedback circuitry to facilitate a variable adjustment of a second bias voltage associated with the at least one second semiconductor amplifying component.

It should be appreciated that all combinations of the foregoing concepts and additional concepts discussed in greater detail below are contemplated as being part of the inventive subject matter disclosed herein.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 14-1 is a graphical representation of an adaptive bias control technique implemented by the nonlinear amplifier/filter apparatus shown in FIG. 10, according to one embodiment of the disclosure;

DETAILED DESCRIPTION

Following below are detailed descriptions of various concepts related to, and embodiments of, nonlinear pulse oscillator methods and apparatus according to the present disclosure. It should be appreciated that various aspects of the disclosure as introduced above and discussed in greater detail below may be implemented in any of numerous ways, as the disclosure is not limited to any particular manner of implementation. Examples of specific implementations and applications are provided for illustrative purposes only. Additionally, for purposes of this disclosure, the terms "soliton" or "solitons" should be understood to refer not only to pure soliton waveforms or cnoidal waves, but also to nonlinear pulses that may not have exactly a soliton waveform, but nonetheless significantly resemble solitons and behave effectively like solitons in a given environment (i.e., "quasi-solitons").

Figure 7:
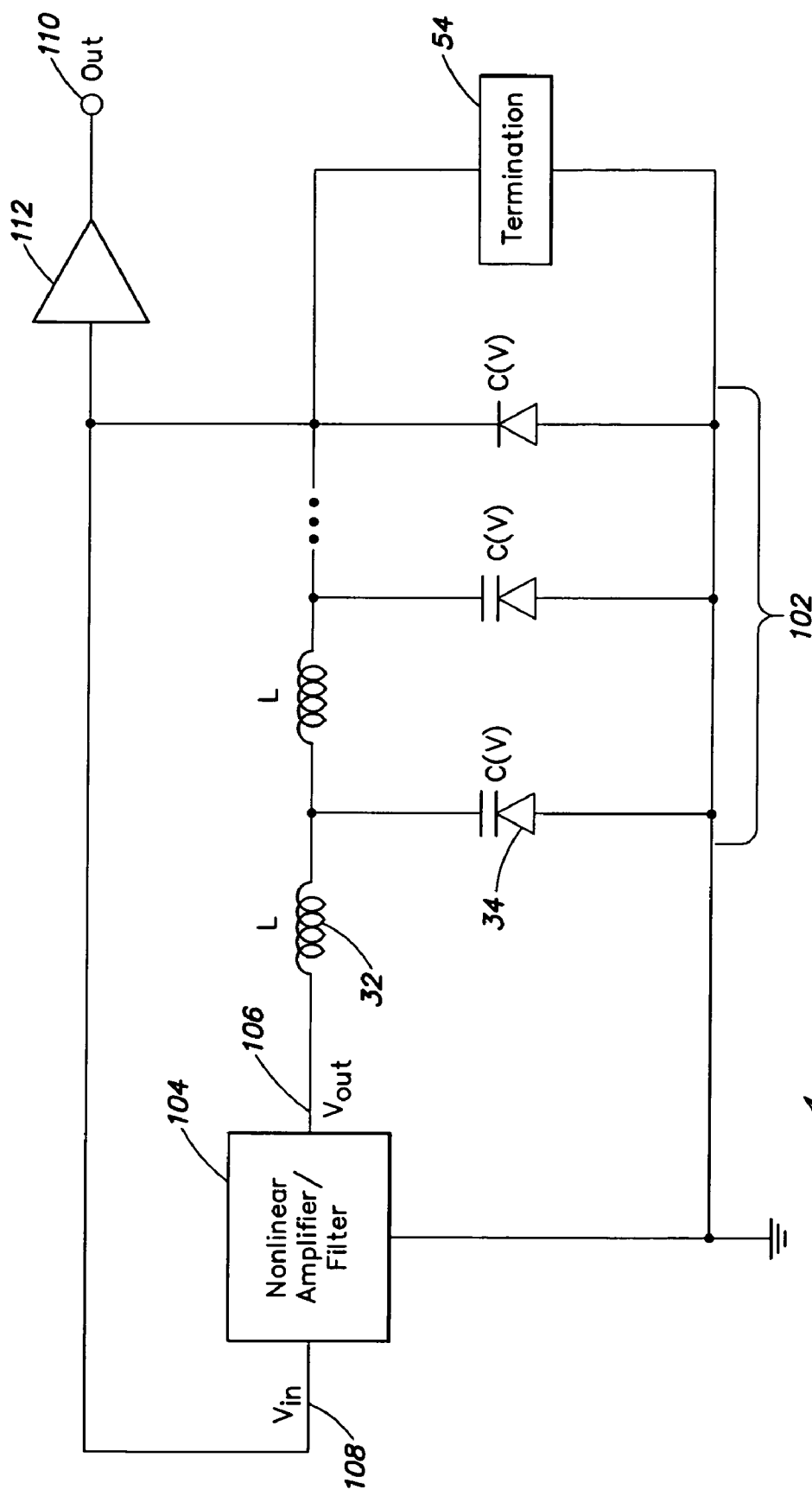
FIG. 7 illustrates a generalized block diagram of a soliton oscillator apparatus according to one embodiment of the present disclosure.

FIG. 7 illustrates a generalized block diagram of a soliton oscillator apparatus 100 according to one embodiment of the present disclosure. The soliton oscillator of FIG. 7 is arranged as a closed loop system comprising a nonlinear amplifier/filter apparatus 104 coupled to a nonlinear transmission line 102. In particular, an output 106 of the nonlinear amplifier/filter apparatus 104 is coupled to one end of the nonlinear transmission line 102 to drive the transmission line, and an input 108 to the nonlinear amplifier/filter apparatus is taken from a node at a point along the nonlinear transmission line some distance from the amplifier output 106. An output 110 of the apparatus may be provided by a conventional buffer amplifier 112 coupled to some point in the loop, so as to "tap off" the circulating soliton signal(s) without unduly loading the apparatus.

Figure 4:
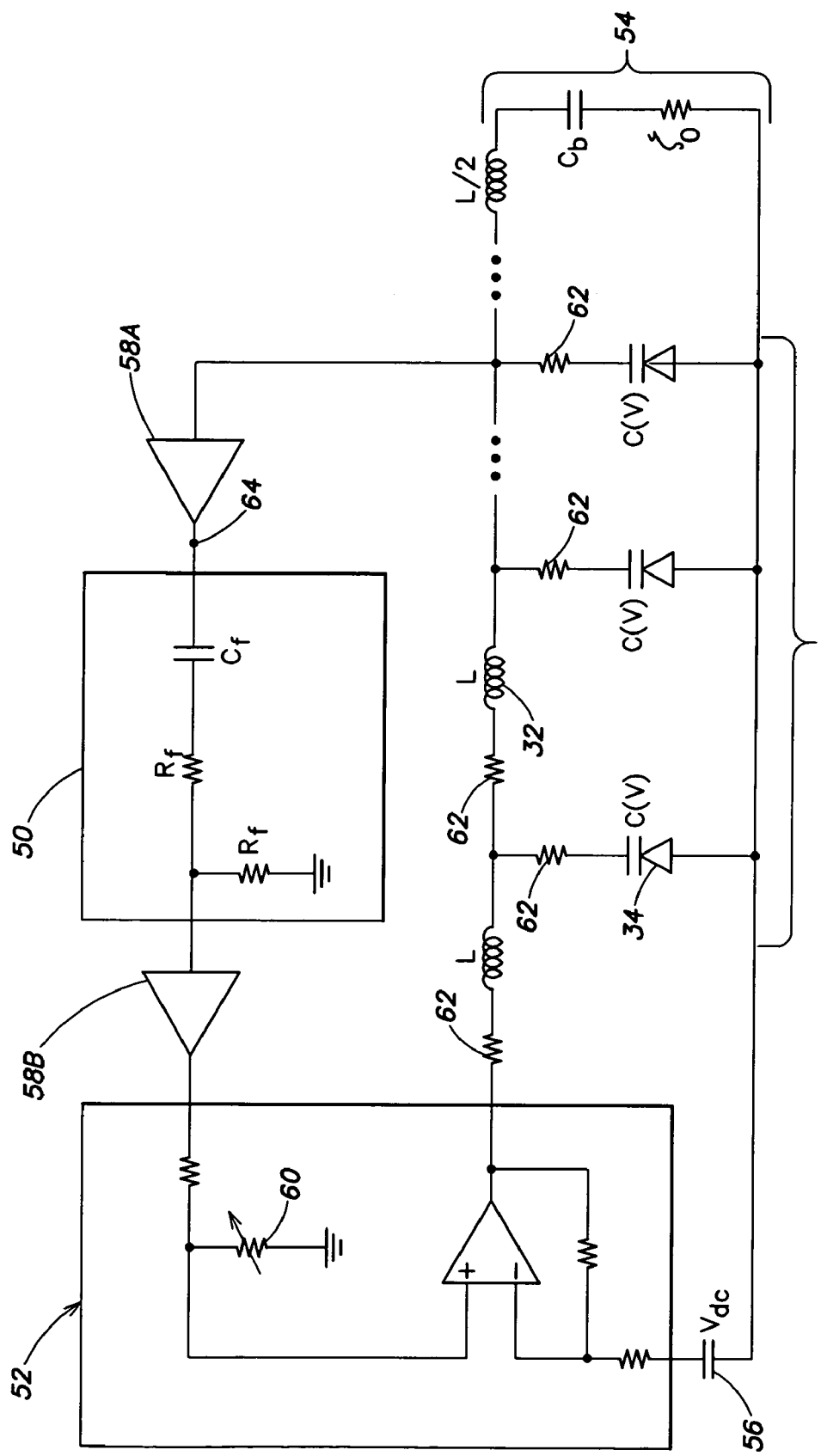
FIG. 4 illustrates a known soliton oscillator employing a nonlinear transmission line, a high pass filter and a linear amplifier.
Figure 5:
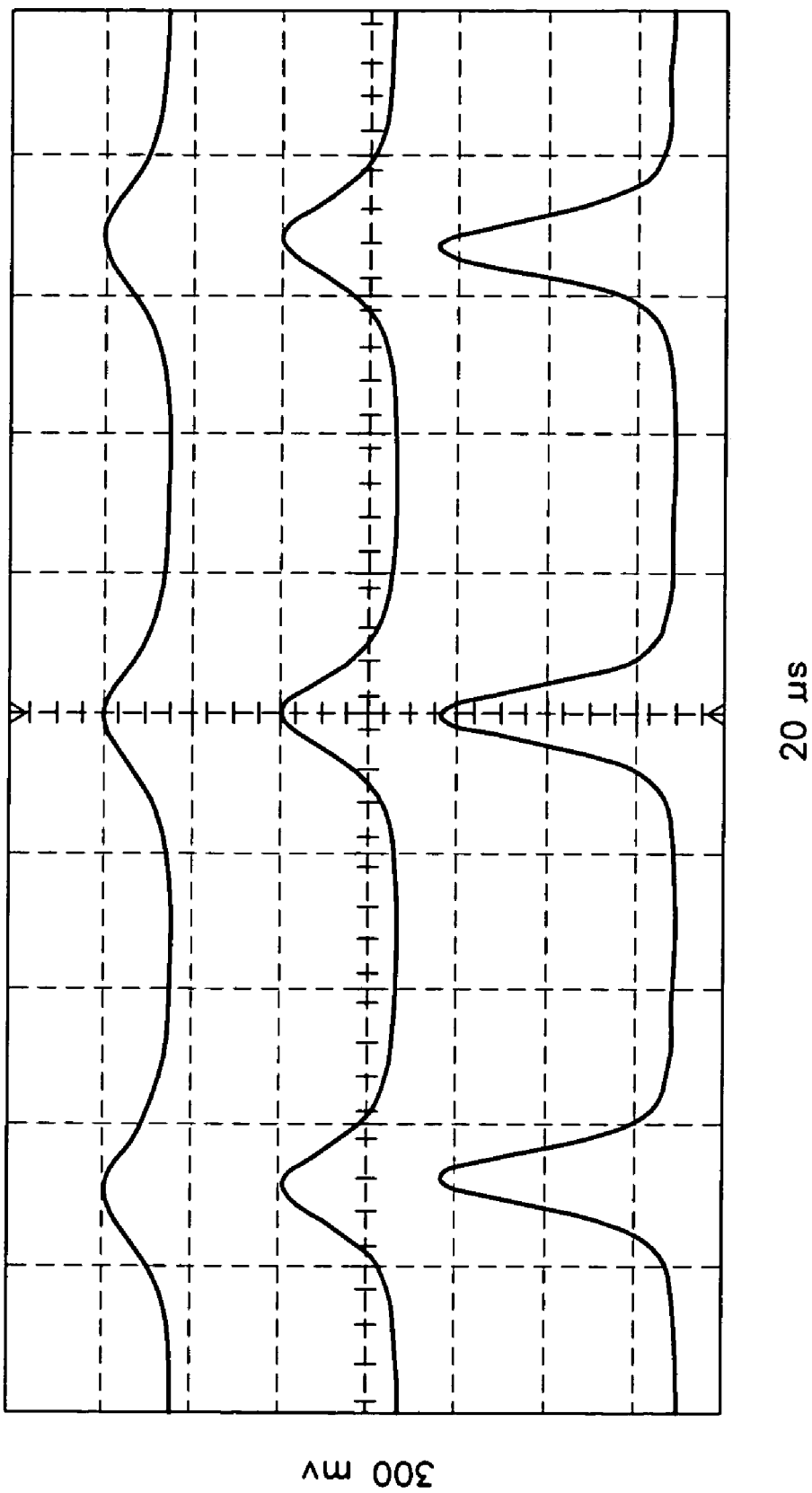
FIG. 5 illustrates the effect of varying a gain of the linear amplifier in the circuit of FIG. 4.
Figure 6:
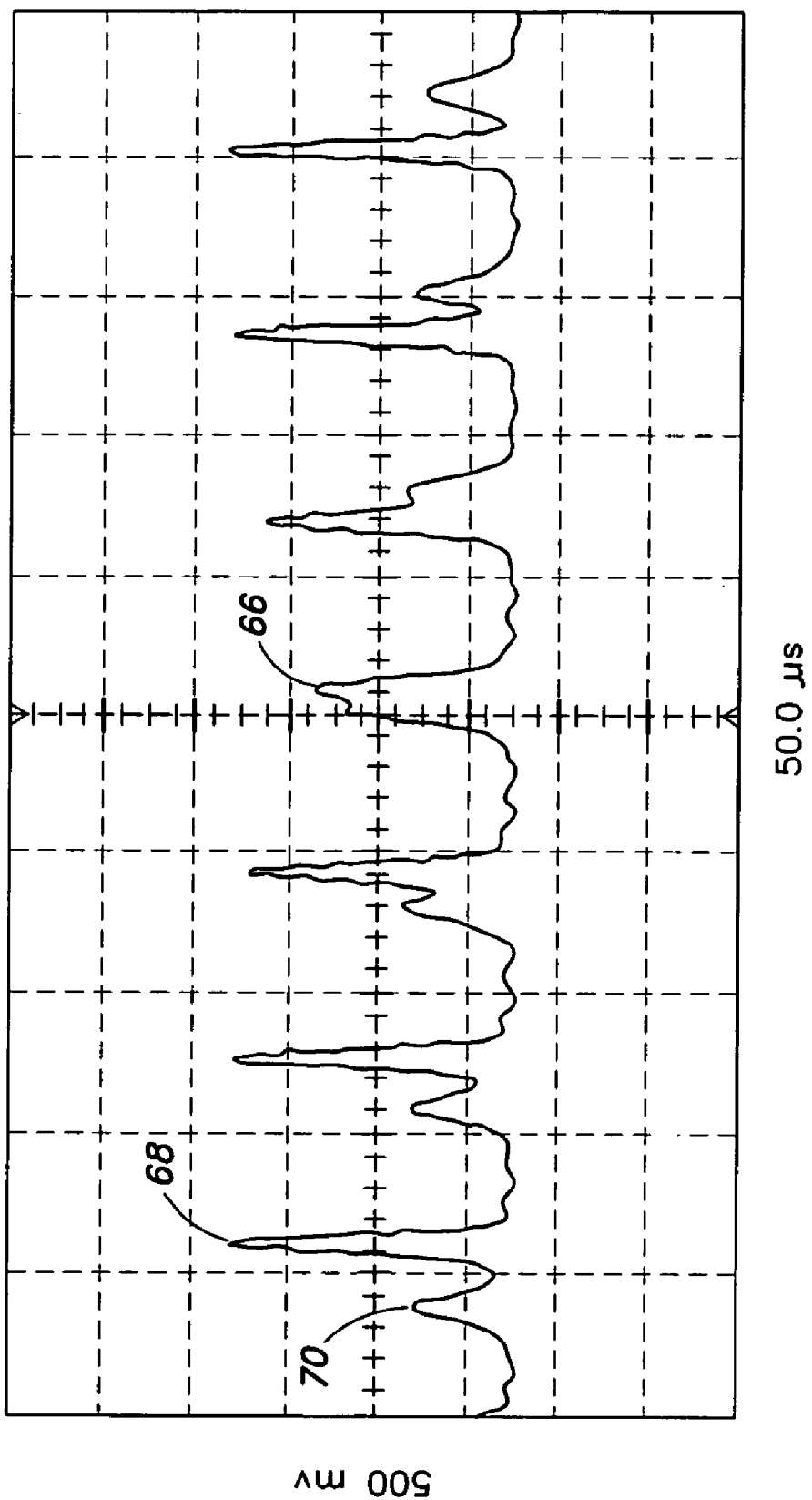
FIG. 6 illustrates the collision of multiple solitons in the circuit of FIG. 4.

As illustrated in FIG. 7, the nonlinear transmission line 102 is similar to that discussed above in connection with FIG. 4 in that it includes a number of inductors 32 having an inductance L, a number of varactor diodes 34 having a voltage dependent capacitance C(V), and a termination 54 that approximates a matched load for the transmission line. However, one noteworthy difference between the nonlinear transmission line 102 according to the embodiment of FIG. 7 and the nonlinear transmission line 30A in the circuit of FIG. 4 is that, in the embodiment of FIG. 7, no resistors are required in the transmission line to deliberately increase losses in the line so as to facilitate operation of the oscillator. More specifically, recall that in the circuit of FIG. 4, additional resistors 62 are required in the series and shunt branches of the transmission line 30A to permit the circuit to function. Again, in the embodiment of FIG. 7, there is no such requirement for additional line losses to ensure operation of the oscillator, thereby lowering power requirements and reducing wasted energy resources during normal operation.

In the soliton oscillator apparatus 100 of FIG. 7, the operating frequency of the apparatus refers generally to the repetition rate of one or more solitons circulating in the apparatus (i.e., based on the temporal distance between consecutive solitons), as observed at a particular point along the loop (e.g., at the output 110). As discussed briefly above, the range of operating frequencies supported by an oscillator circuit such as FIG. 7 is determined generally by the inductance value L of the inductors 32 used in the nonlinear transmission line 102, the range of values for the variable capacitance C(V) of the varactor diodes 34, and the number of nodes or inductor-varactor diode sections of the nonlinear transmission line over which a given soliton travels between the input 108 and the output 106 of the nonlinear amplifier/filter apparatus 104. In general, among virtually infinite possible soliton propagation modes, initial and/or boundary conditions of the nonlinear transmission line contribute to determining one or a number of soliton modes that could propagate essentially unchanged on the nonlinear transmission line.

In one exemplary implementation discussed in greater detail below, the soliton oscillator apparatus 100 of FIG. 7 is designed to support operating frequencies in the gigahertz (GHz) range (e.g., a repetition rate of in a range of approximately 1 to 2 GHz, with some frequency content up to approximately 5-10 GHz in the oscillator spectrum). However, it should be appreciated that different implementations of the soliton oscillator apparatus 100 according to various embodiments of the present disclosure may be designed to support virtually any frequency range of operation for a given application.

According to various embodiments outlined in greater detail below, the amplifier functionality of the nonlinear amplifier/filter apparatus 104 generally is configured to ensure predictable and stable operation of the soliton oscillator apparatus 100 by selectively facilitating propagation of solitons having a particular predetermined desired amplitude $A_{des}$. To this end, the nonlinear amplifier/filter apparatus is configured generally to amplify oscillator signals having a level lower than the desired soliton amplitude $A_{des}$ and, conversely, attenuate signals having a level higher than the desired amplitude, such that the average gain G for the oscillator signal is unity. Stated differently, for a given desired oscillation condition, the gain provided by the nonlinear amplifier/filter apparatus equals any losses in the overall system.

Figure 8:
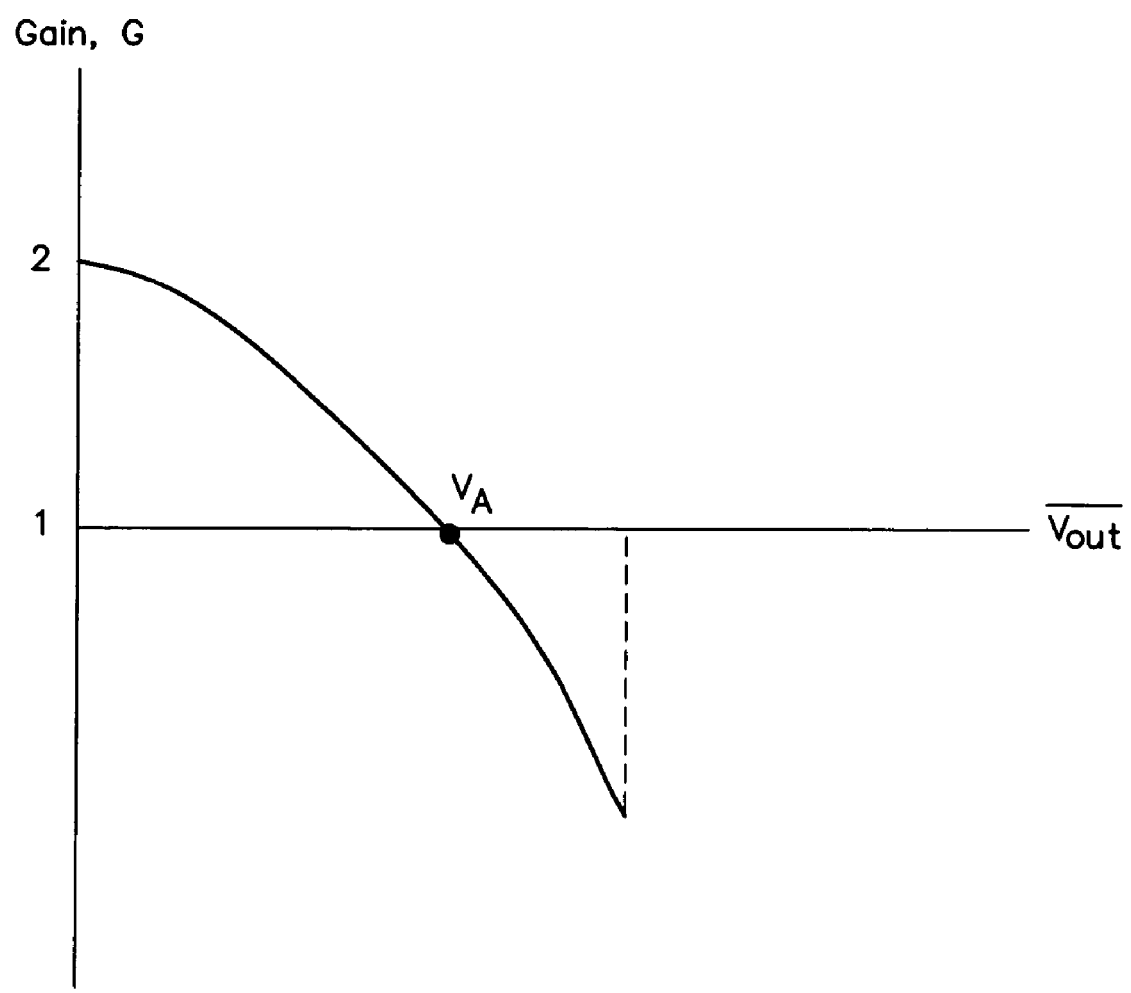
FIG. 8 is a graph illustrating an exemplary relationship between gain and input voltage for the nonlinear amplifier/filter apparatus of the soliton oscillator apparatus shown in FIG. 7, according to one embodiment of the disclosure.

FIG. 8 is a graph illustrating an exemplary qualitative relationship between the gain G of the nonlinear amplifier/filter apparatus 104 vs. an average voltage $\overline{V_{out}}$ of an oscillator signal provided at the output 106 of the nonlinear amplifier/filter apparatus 104, according to one embodiment of the disclosure. As shown in FIG. 8, when the average voltage $\overline{V_{out}}$ of the output signal has a voltage value $V_A$ that represents the desired amplitude $A_{des}$, the gain G is unity. If the average voltage of the output signal is less than $V_A$, the gain is greater than unity, whereas if the average voltage of the output signal is greater than $V_A$, the gain is less than unity. Based on the foregoing, one exemplary relationship for the gain may be given as:

$$G = 2 - \frac{\overline{V_{out}}}{V_A}, \qquad (4)$$

wherein the maximum gain of the amplifier is two (2) for very small output signals. In one exemplary implementation of the nonlinear amplifier/filter apparatus 104, as discussed further below in connection with FIG. 10, the signal passing through the apparatus 104 is averaged over an appropriate number of pulses to effectively represent the average voltage $\overline{V_{out}}$ of the output signal in Eq. (4) above; as a result, the gain G is adjusted gradually according to Eq. (4) over multiple pulses to facilitate stable operation of the oscillator.

As mentioned briefly above, the nonlinear gain functionality represented in FIG. 8 is akin to the situation of a ball sitting in the bottom of a bowl (and unlike the illustrative situation for a linear amplifier, which is akin to a ball precariously balanced on the tip of a pencil). In a nonlinear amplifier according to the present disclosure, the oscillator signal amplitude tends to stay at the desired amplitude $A_{des}$ notwithstanding perturbations to the system (i.e., the ball tends easily to roll back to/stay on the bottom of the bowl notwithstanding perturbations to the bowl). In contrast, in a conventional linear amplifier, extreme care must be taken to "keep the ball balanced on the tip of the pencil," especially in response to disturbances.

In another aspect, the nonlinear amplifier/filter apparatus 104 is configured to be essentially "spectrum-preserving" for soliton (i.e., pure soliton and quasi-soliton) waveforms. In particular, although the nonlinear amplifier functionality according to this aspect introduces significant distortion for waveforms other than solitons, the combination of the nonlinear amplifier functionality and filtering functionality of the nonlinear amplifier/filter apparatus 104 is particularly configured to introduce virtually no significant distortion to solitons. The selective "spectrum-preserving" nature of the apparatus 104 with respect to solitons, coupled with the self-adjusting nonlinear gain functionality, significantly facilitates an appreciably stable soliton oscillation.

In some exemplary embodiments, the self-adjusting nonlinear gain functionality and spectrum-preserving nature of the apparatus 104 described above may be implemented via an adaptive-bias control technique. In this technique, a bias point of an amplifier stage is adjusted based on a DC component of the amplifier stage's output, so as to change amplifier gain based on the signal itself being amplified. The variable bias point, relative to a threshold voltage of the amplifier stage, constitutes a threshold-dependent gain/attenuation mechanism which essentially represents an electric circuit implementation of a saturable absorber (e.g., an optical component having a certain optical loss that is reduced for relatively higher optical intensities). This mechanism significantly facilitates robust, stable operation of the overall oscillator by effectively reducing distortion to pulses propagating in the oscillator, rejecting perturbations to the system, and ensuring the selection and propagation of a single mode Additionally, in some embodiments, the filtering functionality of the nonlinear amplifier/filter apparatus 104 is particularly tailored to permit only single mode operation, again ensuring predictable and stable operation of the soliton oscillator. For example, according to one embodiment discussed further below, the frequency response of the filtering functionality of the nonlinear amplifier/filter apparatus 104 may be particularly selected so as to prohibit collisions of multiple different-amplitude solitons. The filter design according to this embodiment takes advantage of the fact that collisions of multiple different-amplitude solitons tend to skew the frequency spectrum of the oscillator toward higher power at lower frequencies (i.e., energy is transferred from higher frequency spectrum components to lower frequency spectrum components). Accordingly, by designing the filtering functionality to appropriately attenuate lower frequency spectrum components characteristic of soliton collisions, such collisions may be effectively precluded from forming in the oscillator.

It should be appreciated that the respective nonlinear amplifier and filtering functionalities of the nonlinear amplifier/filter apparatus 104 shown in FIG. 7 may be implemented in any of numerous ways, and that the disclosure is not limited to any particular manner of implementation. For example, in one arrangement, the nonlinear amplifier functionality may be implemented by one group of components forming circuitry dedicated primarily to the amplification/attenuation function, whereas the filtering functionality may be implemented by another different group of components forming circuitry dedicated primarily to the filtering function. Alternatively, various components of an overall circuit implementation for the nonlinear amplifier/filter apparatus 104 may have roles in realizing some part of both the nonlinear amplifier functionality and the filtering functionality. Additionally, one or both of the nonlinear amplifier functionality and the filtering functionality may be configured in multiple circuit stages that may be arranged in a variety of ways to implement the various operating concepts discussed herein. For purposes of illustrating some salient concepts germane to the present disclosure, one exemplary implementation of the nonlinear amplifier/filter apparatus 104 is now discussed in detail below.

Figure 9:
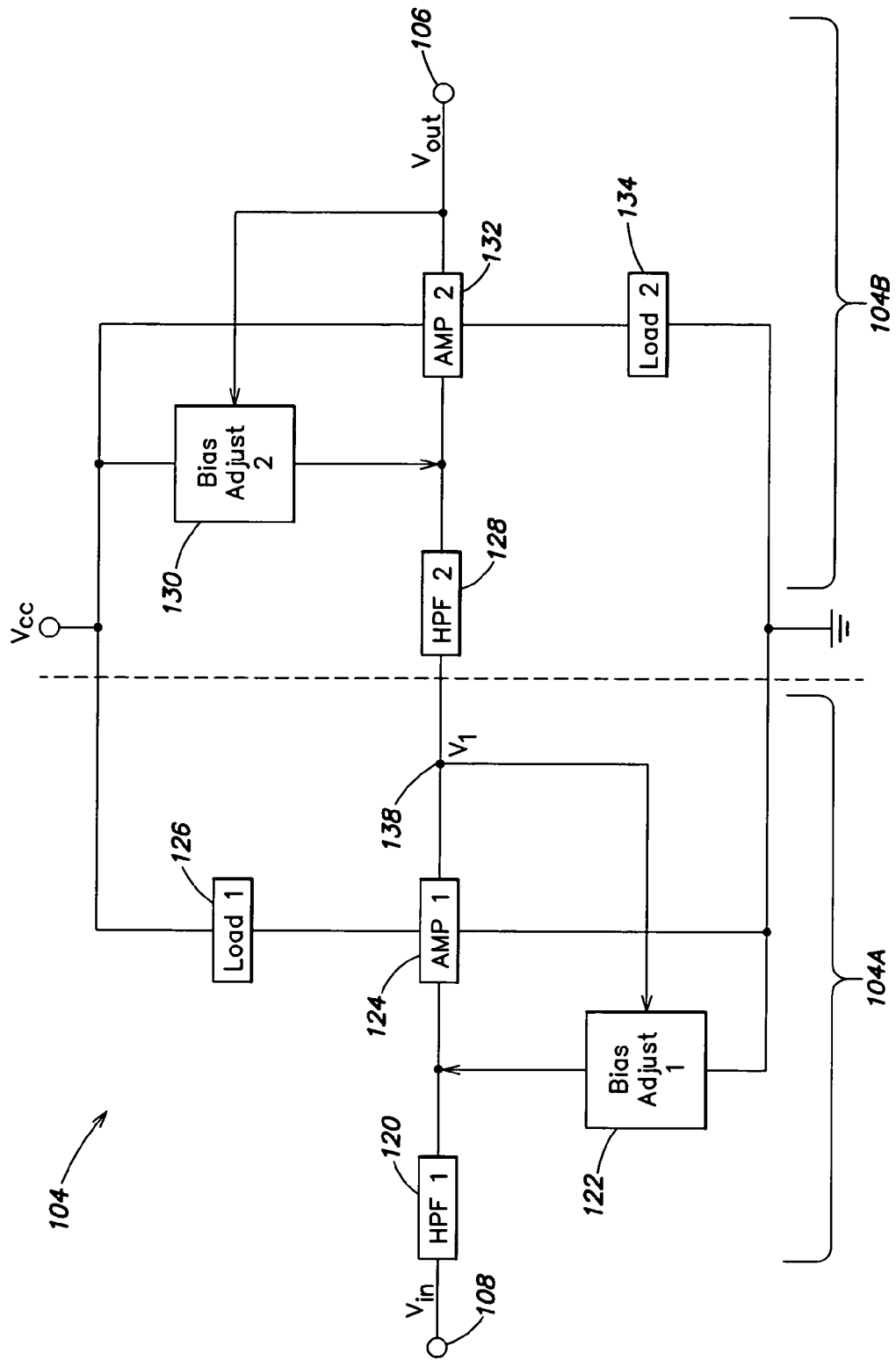
FIG. 9 is a block diagram illustrating an exemplary implementation of the nonlinear amplifier/filter apparatus shown in FIG. 7, according to one embodiment of the disclosure.

FIG. 9 is a block diagram showing an example of the nonlinear amplifier/filter apparatus 104 according to one embodiment of the disclosure. In the embodiment of FIG. 9, the nonlinear amplifier/filter apparatus 104 is implemented as a two-stage complimentary amplifier arrangement, where some filtering function is associated with each of two complimentary amplifiers.

In particular, as shown in FIG. 9, a first stage 104A of the apparatus 104 comprises the input 108 (at which an oscillator signal $V_{in}$ is applied), a first high pass filter 120 (HPF1) and a first amplifier 124 (AMP1), whereas a second stage 104B comprises a second high pass filter 128 (HPF2), a second amplifier 132 (AMP2) and the output 106 (at which an oscillator signal $V_{out}$ is provided). A signal node between the first and second stages (i.e., output of first stage/input of second stage) is indicated as the node 138 in FIG. 9 and an instantaneous voltage of the signal at this node is indicated as $V_I$. In one aspect of this embodiment, the first and second amplifiers 124 and 132 may be implemented as complimentary NMOS and PMOS transistor circuits, as discussed further below. Additionally, in other aspects of this embodiment, each of the first and second amplifiers 124 and 132 may be implemented with either a resistive or active load, as indicated generally in FIG. 9 by the first load 126 (LOAD1) and the second load 134 (LOAD2), respectively. In FIG. 9, a DC voltage to provide power to various circuit elements is denoted as $V_{CC}$.

In the embodiment of FIG. 9, each stage 104A and 104B of the nonlinear amplifier/filter apparatus 104 also includes amplifier bias adjust circuitry, shown in FIG. 9 as first bias adjust circuitry 122 (BIAS ADJUST 1) and second bias adjust circuitry 130 (BIAS ADJUST 2), respectively, to implement an adaptive bias control technique. In particular, it is a noteworthy aspect of the embodiment of FIG. 9 that the amplifier bias adjust circuitry for each stage is implemented as a feedback loop, in which the output of a given amplifier stage affects the bias point for that stage. As discussed further below, such a feedback arrangement may be employed to not only automatically adjust the gain of each amplifier stage in a predetermined (e.g., nonlinear) manner based on a desired oscillation condition (e.g., target amplitude/desired mode), but also may be used to intentionally introduce distortion that actually favors the propagation and maintenance of solitons as opposed to other waveforms.

Figure 10:
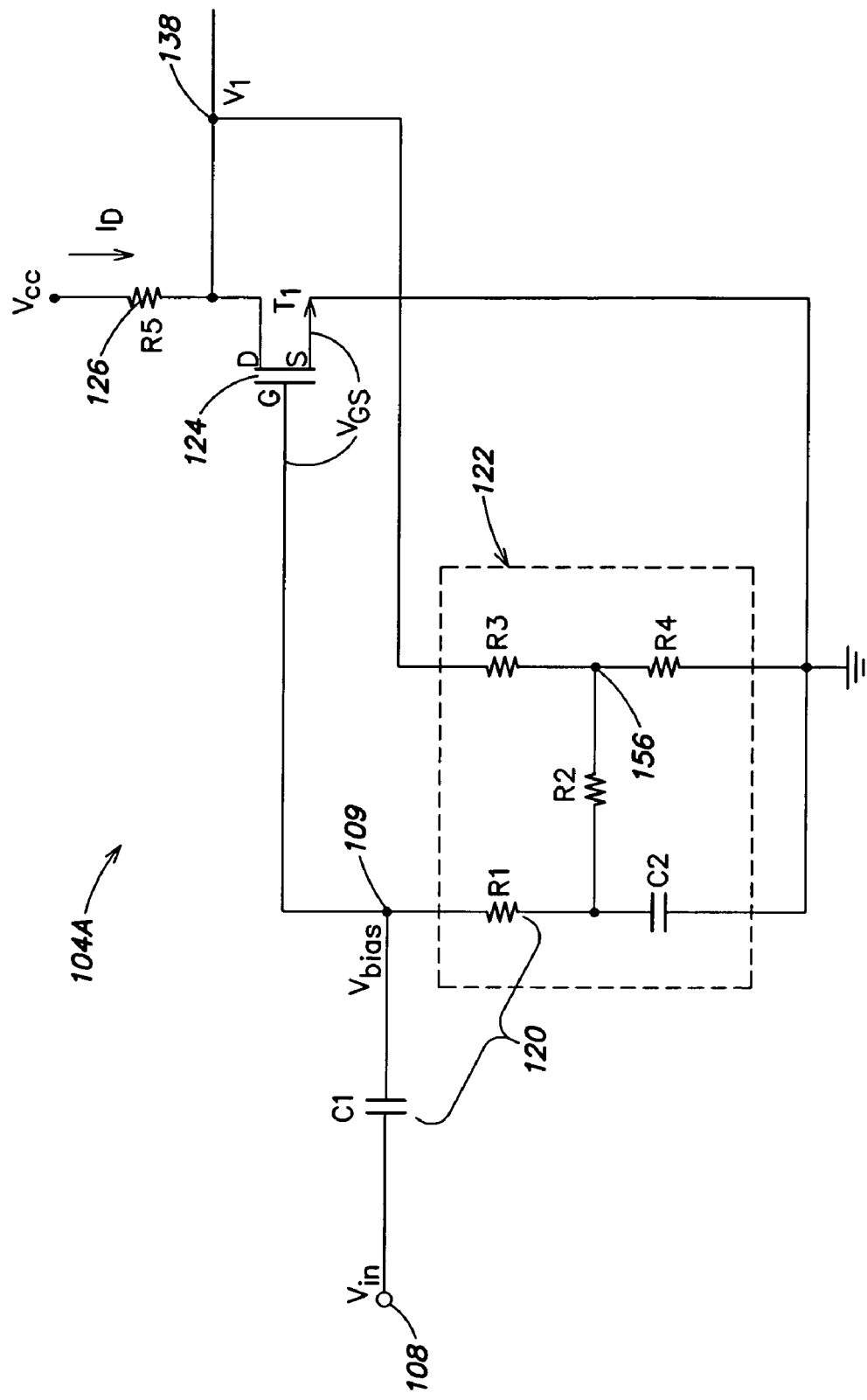
FIG. 10 is a circuit diagram illustrating circuit details of an exemplary first stage of the nonlinear amplifier/filter apparatus of FIG. 9, according to one embodiment of the disclosure.

FIG. 10 is a circuit diagram illustrating details of an exemplary first stage 104A of the nonlinear amplifier/filter apparatus of FIG. 9, according to one embodiment of the disclosure. In the circuit diagram of FIG. 10, the first amplifier 124 is implemented by NMOS transistor T1, and the first load 126 is implemented as a simple resistor R5 (the first load alternatively may be implemented as an active load, as discussed above). As is well known in the art, the amplifying function of the NMOS transistor T1 relates to the drain current $I_D$ that flows through the transistor as a function of a voltage $V_{GS}$ applied between the gate and source of the transistor. In particular, in the circuit of FIG. 10, an instantaneous voltage $V_I$ of the signal output by the first stage 104A at the node 138 is produced by the product of the drain current $I_D$ flowing through the resistance of the load 126 (R5). The drain current $I_D$ in turn generally relates to various physical parameters of the transistor associated with its fabrication, and a difference between the gate-source voltage $V_{GS}$ and a transistor threshold voltage $V_T$, which is the minimum gate-source voltage required to cause some current to flow through the transistor T1 from drain to source ($V_T$ typically is on the order of approximately 0.8 volts). Accordingly, in significant part, given a known load and the physical parameters of the transistor, the gain of the amplifier 124 relates primarily to the difference between the applied gate-source voltage $V_{GS}$ and the transistor threshold voltage $V_T$.

When a MOS transistor is employed as a conventional small-signal linear amplifier (i.e., unlike the circuit shown in FIG. 10) given a known load as described above, typically a fixed DC bias voltage $V_{GS}$ is applied to the gate of the transistor to determine the gain of the amplifier, based on a desired range of output signal amplitudes for a given range of expected small-signal inputs. As the small-signal input fluctuates around this DC bias voltage, various input signal amplitudes are amplified with essentially the same gain factor as determined by the DC bias voltage $V_{GS}$, provided of course that the signal input is such that the maximum amplitude of the output signal is not required to exceed the supply voltage $V_{CC}$ (which physically it cannot do).

Unlike such conventional linear amplifier arrangements, the circuit of FIG. 10 employs amplifier bias adjust circuitry 122 in a feedback arrangement to dynamically vary a bias voltage $V_{GS}$ applied to the transistor T1 (also indicated in FIG. 10 as $V_{bias}$ at node 109), based upon the signal output by the first stage 104A. This feedback arrangement to dynamically control the bias voltage $V_{bias}$ ("adaptive bias control") facilitates the automatic adjustment of amplifier gain to provide a particular desired oscillator condition (e.g., target amplitude/desired mode) for the signal output by the first stage at the node 138. The feedback arrangement also allows an intentional "shutting off" of the transistor T1 for some input signals in a manner that may significantly distort some types of waveforms, but nevertheless actually fosters soliton amplification and propagation. In one aspect, the bias voltage-dependent gain/attenuation mechanism provided by the circuit arrangement shown in FIG. 10 essentially represents an electrical implementation of a saturable absorber, as discussed further below.

In the circuit of FIG. 10, the capacitor C1 and resistive components of the circuitry 122 (e.g., R1) essentially form the first high pass filter 120. In general, with reference again for the moment to FIG. 7, one of the roles of high pass filtering in the oscillator apparatus 100 is to effectively block any DC component of the oscillator signal applied to the input 108 of the nonlinear amplifier/filter 104. In particular, it should be appreciated that for a non-inverting amplifier configuration in a closed loop system such as that shown in FIG. 7, the positive feedback arrangement results in a DC component superimposed on a signal circulating in the system. Accordingly, to provide for appropriate biasing in the amplification circuitry, a signal applied to the input 108 of the nonlinear amplifier/filter 104 needs to be "AC" coupled to the amplifier, i.e., passed through a high pass filter.

Figure 11:
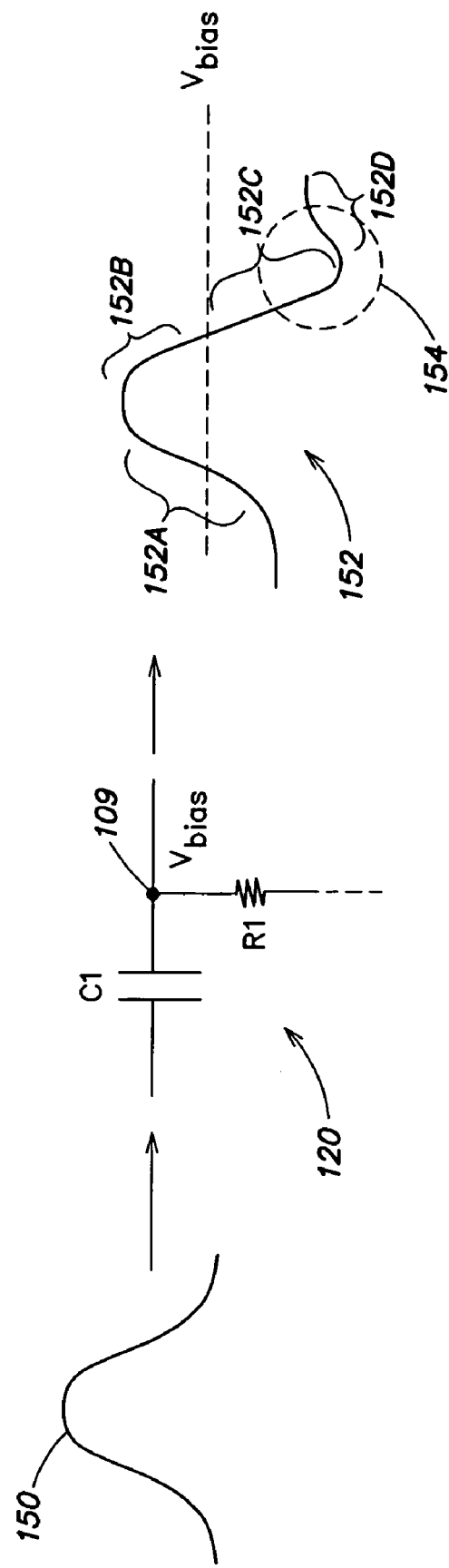
FIG. 11 is a qualitative representation of the process of an exemplary nonlinear pulse waveform passing through a high pass filter, according to one embodiment of the disclosure.

With reference again to FIG. 10, the first high pass filter 120 accordingly provides the necessary AC coupling of the signal to the first amplifier stage 104A. In consideration of solitons or quasi-solitons as nonlinear pulses of interest in the oscillator signal, it is instructive to discuss how high-pass filtering in general affects such pulses. FIG. 11 provides a qualitative schematic representation of this process.

On the left in FIG. 11, a single soliton pulse 150 (e.g., a $\text{sech}^2$ pulse) is shown being applied to a general representation of the first high pass filter 120, in which the filter output bias point $V_{bias}$ also is illustrated. On the right in FIG. 11, a filtered pulse 152 is shown exiting from the high pass filter 120 at the node 109, wherein the filtered pulse 152 is biased around the level $V_{bias}$. Several different portions of the filtered pulse 152 also are labeled in FIG. 11 to facilitate an explanation below of the effects of high pass filtering on the input pulse 150.

The function of a high pass filter generally is to let rapid signal transitions (higher frequencies above the filter's cutoff frequency or "pole") pass essentially undisturbed, and settle at the filter's bias point $V_{bias}$ when the applied signal has slower or no transitions (lower frequencies below the filter's pole). Accordingly, on a rising edge of the input pulse 150 (which represents a rapid signal transition and hence higher frequencies), the filter 120 essentially passes this portion of the input pulse undisturbed, which can be observed in the portion 152A of the filtered pulse 152. Next, the area around the peak of the input pulse 150 represents a slower signal transition and hence lower frequencies; accordingly, at this point, the filter output tends to return to its bias point $V_{bias}$, which can be observed in the portion 152B of the filtered pulse 152 (this process is sometimes referred to as the "reset" of the filter). However, as this "reset" process is occurring, the filter 120 subsequently attempts to track the rapid signal transition of the falling edge of the input pulse 150, which again represents higher frequencies that are passed by the filter; this situation is illustrated in the portion 152C of the filtered pulse 152. As the input pulse comes to an end, the filter output again tends to return to its bias point (another "reset"), as shown in the portion 152D of the modified pulse 152.

In the scenario outlined in connection with FIG. 11, it is noteworthy that the filter 120 introduces an artifact in the resulting filtered waveform that was not present in the input pulse waveform, as may be observed for example in the circled portion 154 of the filtered pulse 152. This artifact is due at least in part to the process of the filter trying to track the falling edge of the input pulse 150 following an attempt by the filter to reset around the peak of the input pulse. More specifically, at the peak of the input pulse, the filter output begins to reset (fall toward its bias point), as illustrated in the portion 152B of the filtered pulse. As the input pulse rapidly traverses its falling edge, the filter tracks this rapid transition as illustrated in the portion 152C. If the input pulse 150 is symmetrical in shape, it should be appreciated that the portions 152A and 152C of the filtered pulse are essentially equal in dimension, as the rising and falling edges of the input pulse are essentially identical. Accordingly, due to the "reset portion" 152B and essentially equal portions 152A and 152C, the filter output may continue falling to a level that is actually below where the filtered pulse began (e.g., at the bottom of the portion 152A), thereby creating a "tail hump" as shown in the circled portion 154 of the filtered pulse.

Figure 12A:
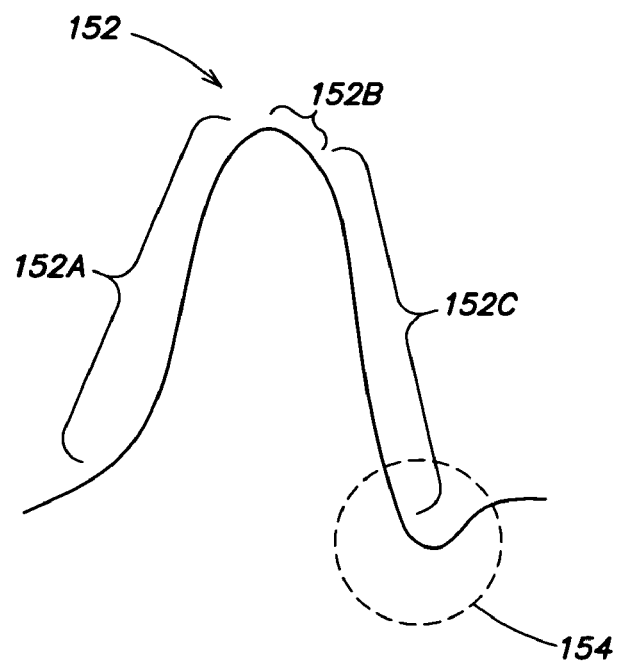
FIGS. 12A and 12B are qualitative representations of the effect of the high pass filter's cutoff frequency on a pulse output by the filter in the representation of FIG. 11.
Figure 12B:
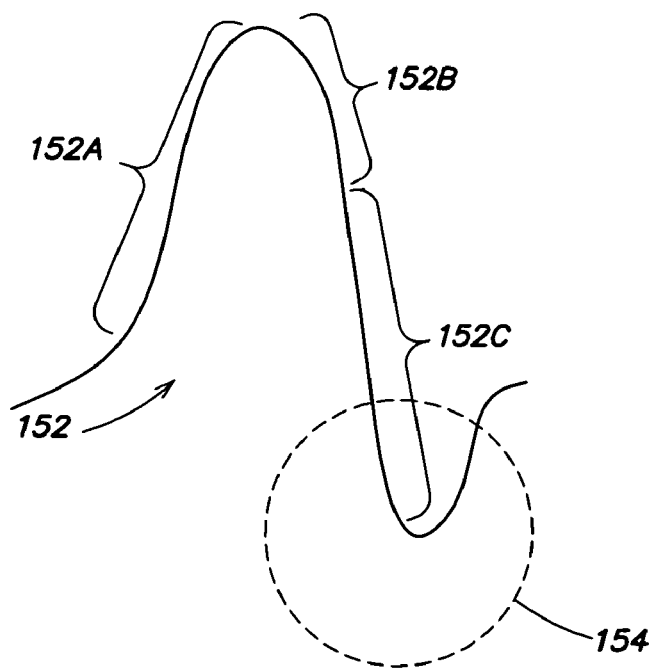

As illustrated qualitatively in FIGS. 12A and 12B, the magnitude of this "tail hump" introduced by the filter depends at least in part on the value of the cutoff frequency or pole of the filter 120, which in turn affects the reset period of the filter. For example, if the cutoff frequency is relatively low, the reset period of the filter (i.e., the portion 152B of the filtered pulse) is shorter, and the filtered pulse more closely resembles the input pulse 150, albeit with a relatively small tail hump 154. This condition is illustrated in FIG. 12A. In contrast, if the cutoff frequency of the filter is relatively high, the reset period of the filter (i.e., the portion 152B of the filtered pulse) is longer, and the filtered pulse has a relatively larger, more pronounced tail hump 154, as illustrated in FIG. 12B. While only illustrated qualitatively in FIGS. 12A and 12B, again it should be appreciated that in both cases, the portions 152A and 152C of the filtered pulses are essentially equal in dimension; hence, the greater the portion 152B, the greater the magnitude of the tail hump 154.

According to one embodiment, the cutoff frequency of the filter 120 (and/or the cutoff frequency of the second high pass filter 128 in the second stage 104B) is selected to facilitate single mode operation of the oscillator apparatus 100. In particular, in one embodiment, the cutoff frequencies of the filters 120 and 128 are particularly selected so as to prohibit collisions of multiple different-amplitude solitons. The filter design according to this embodiment takes advantage of the fact that collisions of multiple different-amplitude solitons tend to skew the frequency spectrum of the oscillator toward higher power at lower frequencies (i.e., energy is transferred from higher frequency spectrum components to lower frequency spectrum components). Accordingly, by selecting filter cutoff frequencies to appropriately attenuate lower frequency spectrum components characteristic of soliton collisions, such collisions are effectively precluded from forming in the oscillator. In one exemplary implementation, the cutoff frequency of the first filter 120 may be on the order of approximately 500 kHz and the cutoff frequency of the second filter 128 may be on the order of 100 to 250 kHz, given an oscillator operating frequency in a range of approximately 1 MHz. Of course, pursuant to the discussion above, the selection of filter cutoff frequencies to facilitate single mode operation should take into consideration any effects on the pulse waveform (i.e., artifacts) resulting from filtering.

In view of the foregoing, with reference again to FIG. 10, it should be appreciated that the requirement of high pass filtering to remove a DC component of the oscillator signal, and optionally facilitate single mode operation, results in a signal to be amplified at the node 109 that has a different waveform than the oscillator signal applied to the input 108. Thus, according to one embodiment, the subsequent amplifying functionality involves both amplification/attenuation of the signal as appropriate, as well as "restoration" of the amplified signal so as to more closely resemble the desired nonlinear pulse waveform for circulation in the oscillator. To this end, the amplifier bias adjust circuitry 122 of the circuit shown in FIG. 10 is configured to dynamically vary the bias voltage $V_{bias}$ at node 109 (which is applied to the transistor T1 as $V_{GS}$) to not only automatically adjust the gain of the amplifier stage in a predetermined manner based on a desired oscillation condition (e.g., signal amplitude/mode) at the node 138, but also to intentionally "distort" the filtered pulse so as to remove the "tail hump," thereby restoring a more soliton-like (quasi-soliton) waveform for propagation in the oscillator.

Regarding the components of the amplifier bias adjust circuitry 122 shown in FIG. 10, the resistors R3 and R4 form a voltage divider to sample a portion of the signal output by the first stage 104A at the node 138; i.e., a scaled version of the output signal at node 138 is provided at the node between R2, R3 and R4 as a feedback signal 156. This feedback signal is then applied to a low pass filter formed by R2 and C2, which essentially provides as an output (via resistor R1 at the node 109) the DC bias voltage $V_{bias}$. Thus, the bias voltage $V_{bias}$ represents an average of the feedback signal 156 over some predetermined time period based on the component values selected for the low pass filter; stated differently, the feedback signal is averaged over some predetermined number of expected nonlinear pulses passing through the amplifier stages. In one specific implementation example discussed further below, the low pass filter component values are selected such that $V_{bias}$ may vary at approximately one-fifth of the oscillator frequency. The range of values over which $V_{bias}$ may vary is determined at least in part by the component values of the voltage divider formed by R3 and R4.

The operation of the circuit of FIG. 10 is as follows. With no signal applied to the input 108, the circuit for the first stage is configured to provide some initial bias voltage $V_{bias}$ which in turn determines some initial gain; in one embodiment, this initial gain is based in part on Eq. (4) above, which describes the overall gain G of both stages of the nonlinear amplifier/filter apparatus 104. Thus, in one embodiment, the components of the first stage 104A are configured to provide an initial gain that is some portion of an overall maximum gain G equal to two (2), based on an average voltage $\overline{V_{out}}$ of zero (no oscillation signal present). At this maximum gain value, the oscillator may "self-start" by initially amplifying background/ambient noise. The physical parameters of the nonlinear transmission line, as well as the operation of the nonlinear amplifier/filter apparatus as discussed further below, ultimately determine the mode of steady state oscillation that is achieved by the initial amplification of noise.

When some signal of appropriate spectrum is applied to the input 108 and passes through the high pass filter 120, it is biased at $V_{bias}$ at the node 109 and amplified by the amplifier 124 to provide a first stage output signal at the node 138. As long as the output signal remains "unclipped," i.e., the input signal is amplified such that no portion of the output signal exceeds the voltage supply $V_{CC}$, the operation of the first stage remains essentially linear, and the bias voltage $V_{bias}$ remains unchanged.

Figure 13:
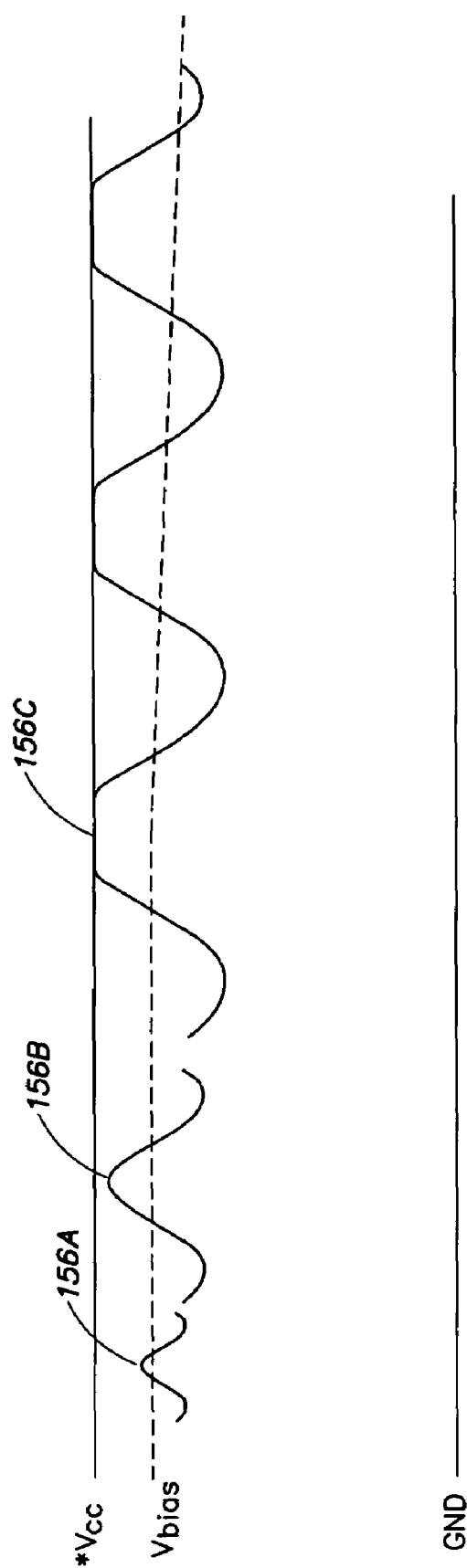
FIG. 13 is a qualitative representation of a nonlinear operation of the first stage of the nonlinear amplifier/filter apparatus shown in FIG. 10, according to one embodiment of the disclosure.

However, if the signal passing through the high pass filter 120 has a relatively larger amplitude such that, once amplified in the first stage, the first stage output signal at the node 138 is "clipped" (i.e., a portion of the signal exceeds the voltage supply $V_{CC}$), the operation of the first stage becomes nonlinear. In particular, in this situation, the feedback signal 156 also is clipped, and as a result the operation of the low pass filter in the bias adjustment circuit 122, which averages the feedback signal 156 over multiple pulses, begins to decrease the bias voltage $V_{bias}$ as a result of the clipped feedback signal. FIG. 13 illustrates this phenomenon.

In FIG. 13, an exemplary sinusoidal feedback signal having different amplitudes is employed to demonstrate the concept of a variable bias voltage $V_{bias}$ in the first stage 104A. Accordingly, it should be appreciated that the following discussion in connection with FIG. 13 is qualitative in nature, and that the waveforms shown in FIG. 13 are not necessarily representative of those actually present in the first stage during normal operation.

In FIG. 13, a ground level (GND) and a "scaled" supply voltage level (*$V_{CC}$) are illustrated as respective horizontal lines, between which the bias voltage $V_{bias}$ is illustrated as a dashed essentially horizontal line. The scaled supply voltage level *$V_{CC}$ represents the portion of the supply voltage $V_{CC}$ at the junction between the voltage divider formed by the resistors R3 and R4 (which "taps off" a portion of the output signal at node 138 to provide the feedback signal 156). On the left in FIG. 13, superimposed on the bias voltage $V_{bias}$, a portion of a relatively smaller amplitude exemplary sinusoidal feedback signal 156A is illustrated at some point in time. Again, with reference to FIG. 10, the exemplary feedback signals shown in FIG. 13 correspond to the node connecting resistors R2, R3 and R4, whereas the bias voltage is observed at the node connecting R1, R2 and C2 (i.e., an output of the low pass filter formed by R2 and C2).

As shown in FIG. 13, the amplitude of the signal 156A is sufficiently below the scaled supply voltage such that no clipping occurs, and no change to $V_{bias}$ is observed. Similarly, a somewhat larger amplitude feedback signal 156B at some other point in time is sufficiently below the scaled supply voltage such that no clipping occurs, and again no change to $V_{bias}$ is observed. However, the exemplary feedback signal 156C at some other point in time is illustrated as clipped, having been derived from an output signal at the node 138 whose amplitude exceeds the supply voltage $V_{CC}$. For purposes of illustration, three cycles of such a clipped feedback signal are shown in FIG. 13. As this clipped feedback signal 156C passes through the low pass filter formed by R2 and C2, the bias voltage $V_{bias}$ begins to drop after multiple cycles, as the average DC component of the clipped feedback signal is lower than the nominal value for $V_{bias}$ As discussed above, the approximate number of cycles over which the feedback signal is averaged so as to provide the bias voltage is determined at least in part by the selection of values for the components R2 and C2.

As the bias voltage $V_{bias}$ begins to drop due to the clipped feedback signal, the instantaneous gain of the transistor amplifier 124 is reduced. Recall that the gain of the amplifier 124 relates primarily to the difference between the applied gate-source voltage $V_{GS}$ (which is $V_{bias}$ in the configuration of FIG. 10) and the transistor threshold voltage $V_T$. Accordingly, the bias voltage $V_{bias}$, as well as the gain of the amplifier 124, begin to fall in value upon significant clipping of the feedback signal 156C. Steady state is achieved when the bias for the input signal creates an output waveform that provides the same bias. This is found to be a point where some nominal degree of clipping occurs since this clipping is used to shape the input signal. In general, the steady state bias is such that the overall gain compensates for signal loss in the oscillator; at steady state the bias is sufficiently reduced so that the peak of the waveform remains substantially in the linear gain region of the amplifier, thereby preventing significant distortion.

Figure 14:
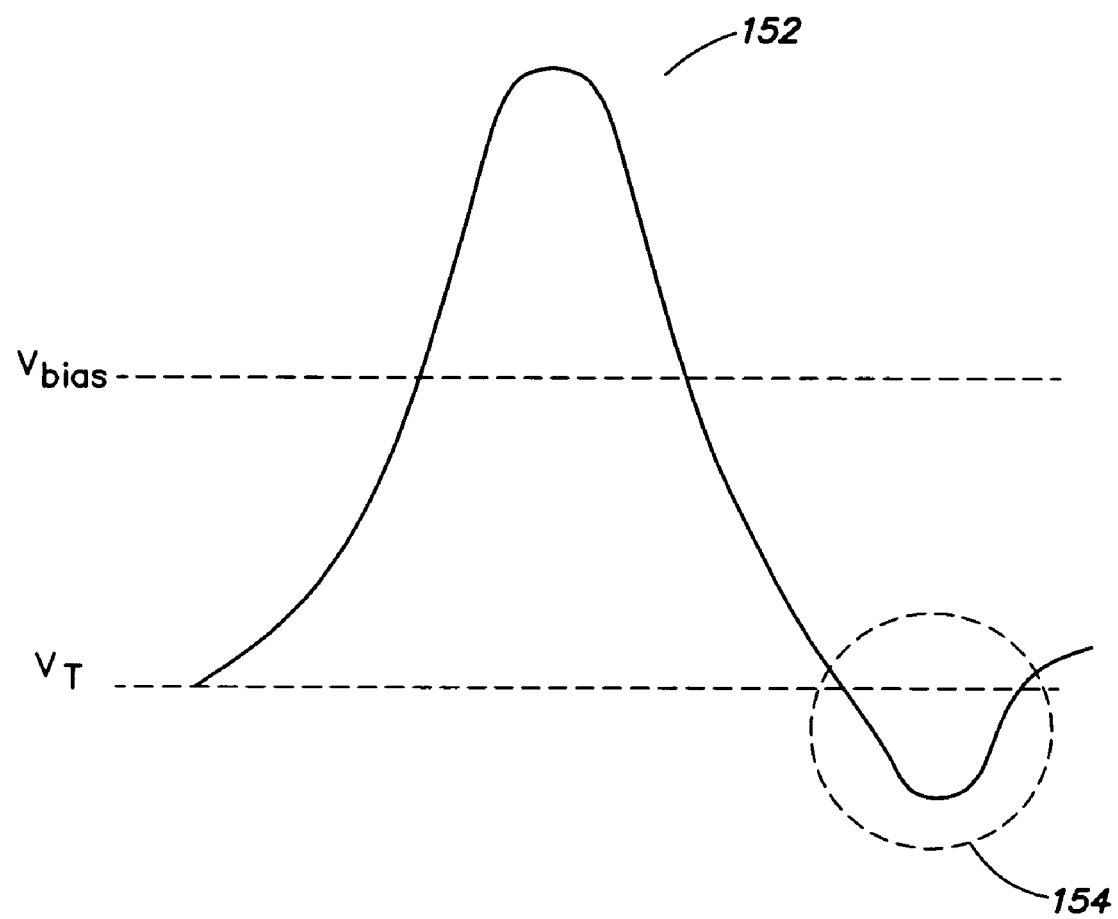
FIG. 14 is a qualitative representation of a signal waveform restoration operation of the first stage of the nonlinear amplifier/filter apparatus shown in FIG. 10, according to one embodiment of the disclosure.
Figures 1, 14:
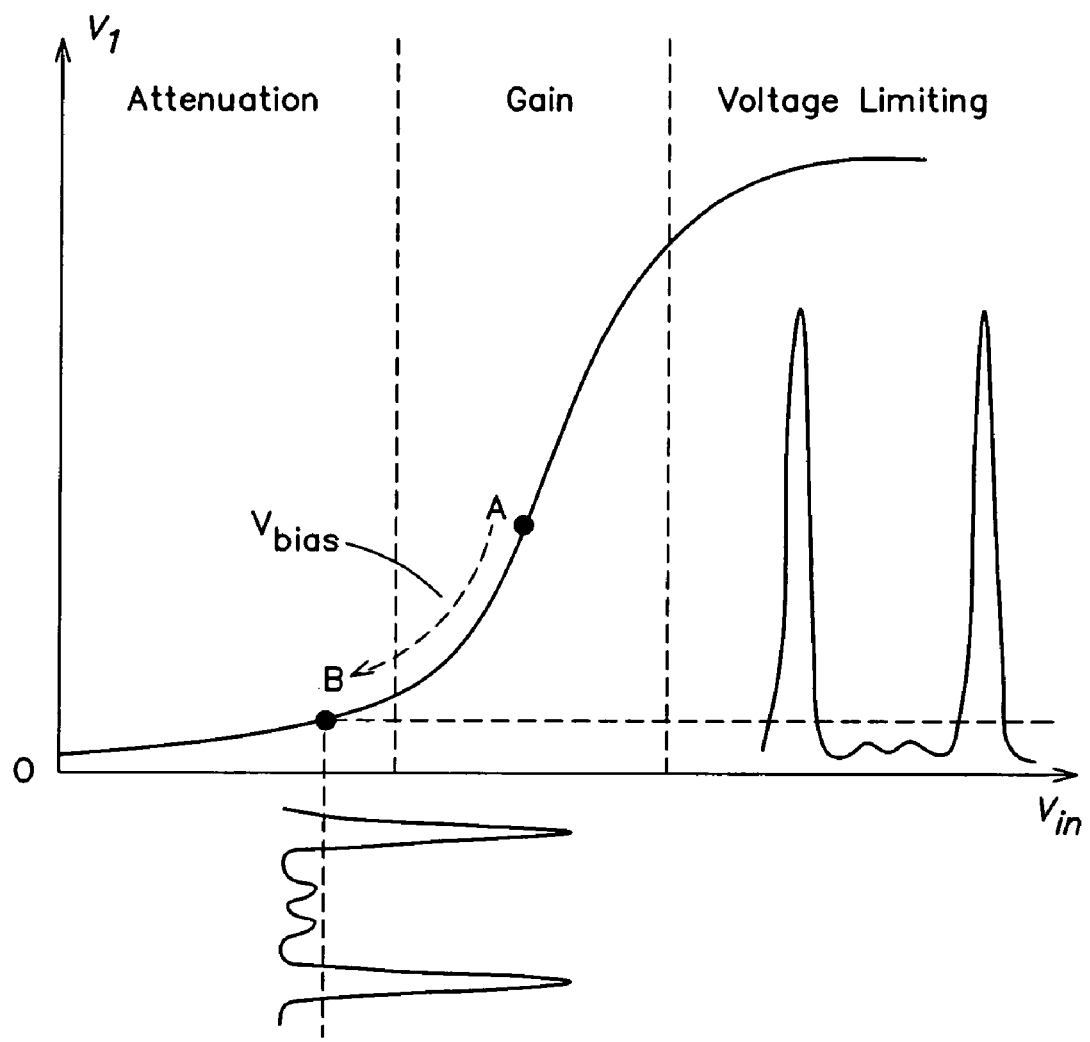

Having addressed the automatic nonlinear gain control functionality of the first stage 104A, the discussion now turns to the "restoration" of the amplified signal so as to more closely resemble the desired nonlinear pulse waveform for circulation in the oscillator. Recall that the signal passing through the high pass filter 120 may to some degree have an artifact in the form of a "tail hump" 154 as discussed above in connection with FIGS. 11 and 12. According to one embodiment, the bias adjust circuit 122 is configured such that the steady state bias voltage level relative to the threshold voltage $V_T$ of the transistor amplifier 124 causes the amplifier 124 not to conduct (i.e., turn off) during the "tail hump" of the signal (or during other similar small amplitude perturbations), thereby essentially removing such artifacts or perturbations from the signal as it propagates through the first stage of the amplifier. FIG. 14 qualitatively illustrates this concept.

In particular, FIG. 14 shows a filtered pulse 152 having a tail hump 154, similar to those illustrated in FIGS. 11 and 12. Superimposed on the pulse 152 of FIG. 14 is the bias voltage $V_{bias}$ and the threshold voltage $V_T$ of the transistor amplifier 124. In one embodiment, a target equilibrium bias voltage is selected such that at least a significant portion of the tail hump 154 of the filtered pulse 152 is below the threshold voltage $V_T$, so that the amplifier 124 is essentially off during this period. As a result, the first stage output signal at the node 138 is effectively free of the artifact of the tail hump 154, and more closely resembles a desired soliton-like waveform. In this manner, the first stage 104A of the amplifier intentionally introduces a significant distortion to the filtered pulse 152 to return it to a soliton or quasi-soliton, thereby effecting a "spectrum-preserving" function of the amplifier. Again, the selective spectrum-preserving nature of the amplifier/filter components with respect to solitons, coupled with the self-adjusting nonlinear gain functionality, significantly facilitates an appreciably stable soliton oscillation.

Figure 1:
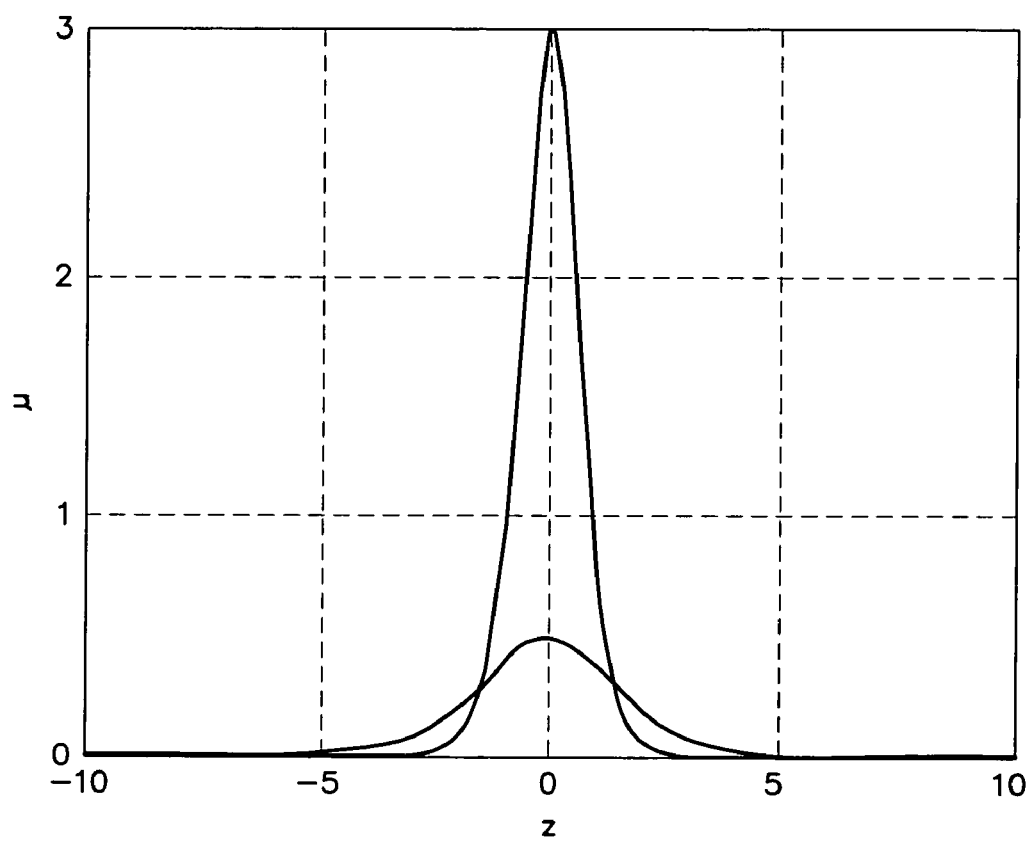
FIG. 1 illustrates two examples of conventional solitons.
Figure 2:
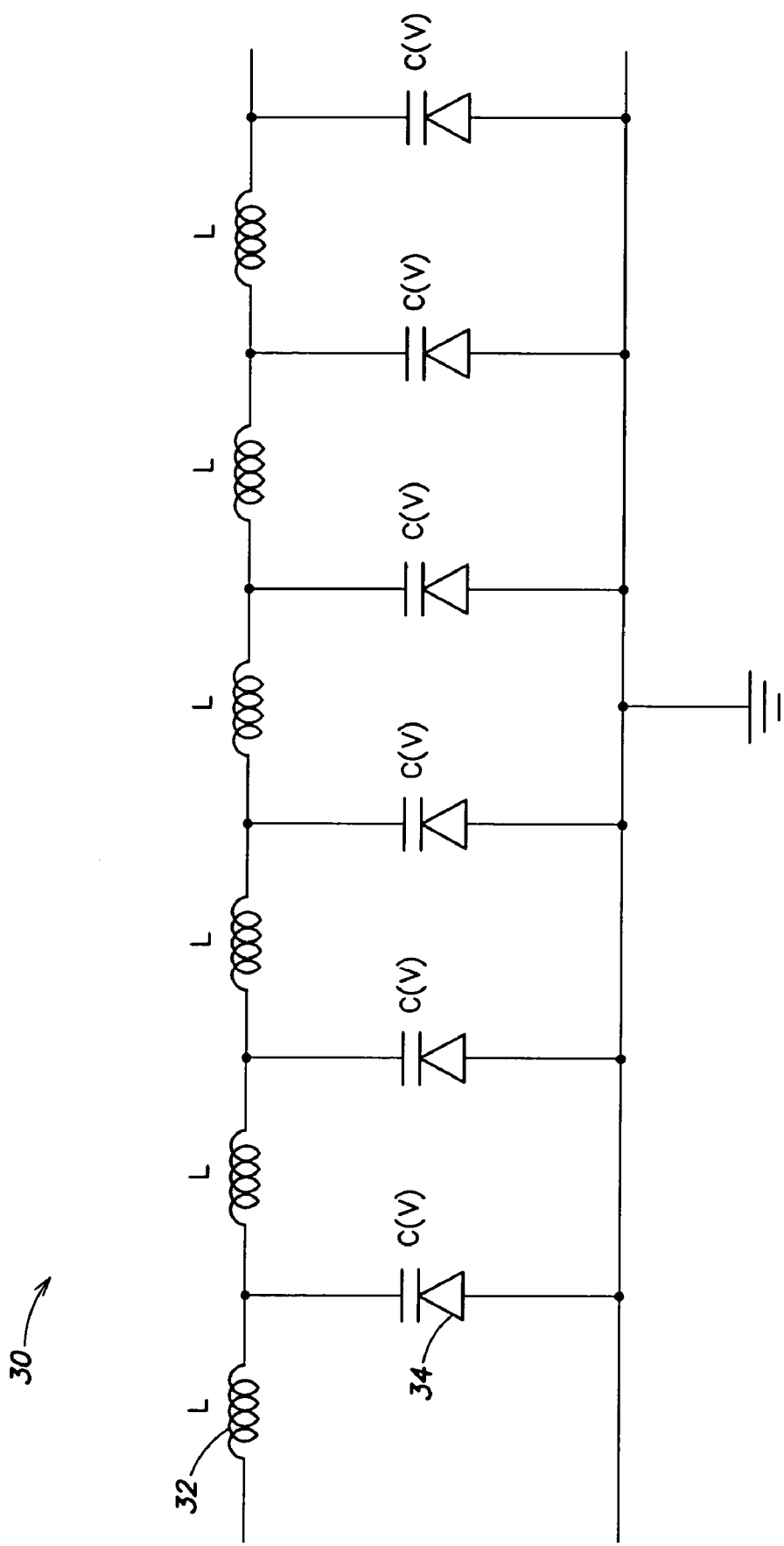
FIG. 2 illustrates an example of a nonlinear transmission line implemented as a lattice using lumped components.
Figure 3:
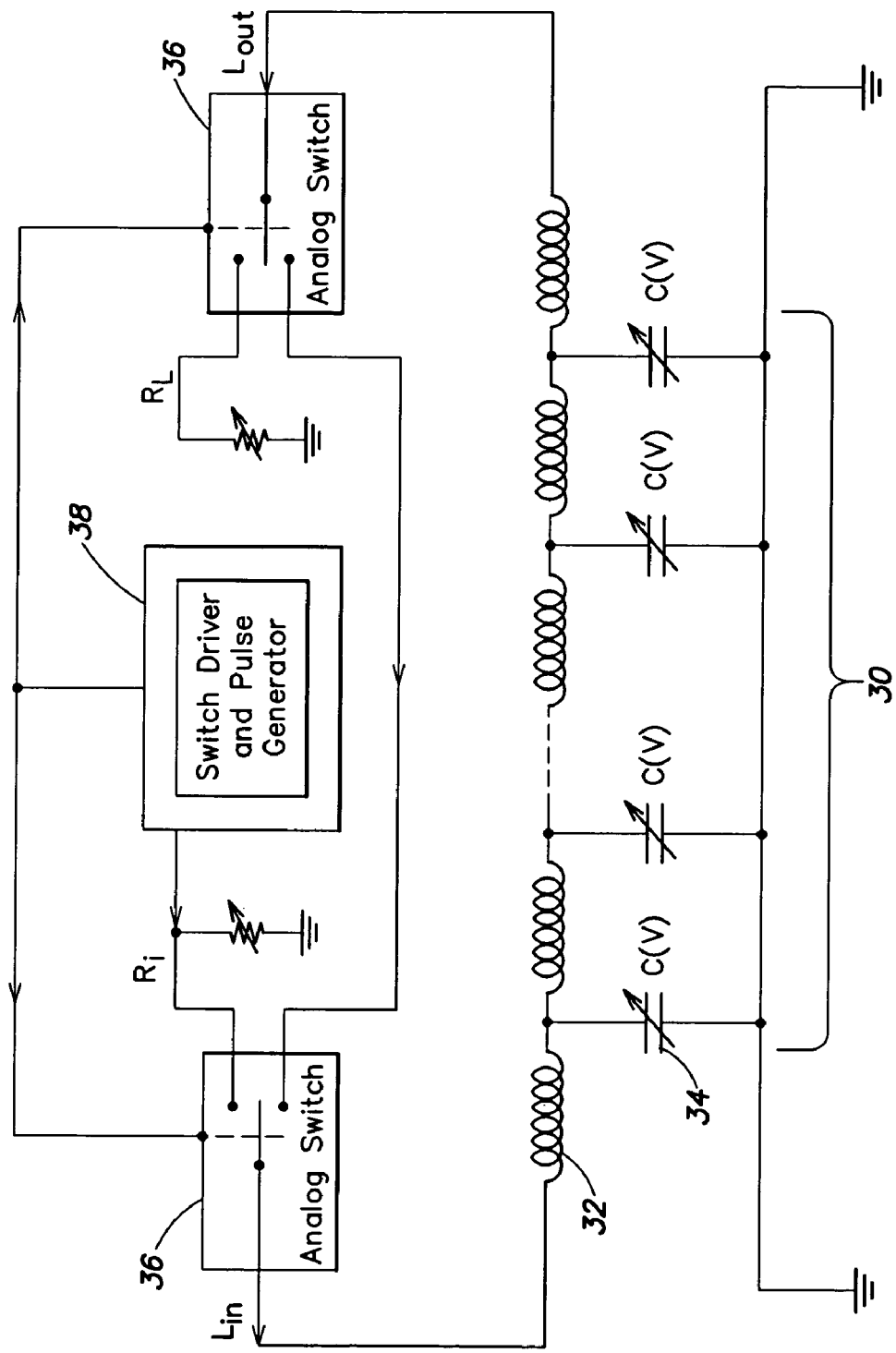
FIG. 3 illustrates a known two-port nonlinear transmission line loop arrangement with switches to observe soliton propagation over distances.

FIG. 14-1 graphically summarizes the foregoing concepts. In particular, FIG. 14-1 illustrates the nonlinear transfer function of the first stage 104A, in which the input signal (Vin) is represented on the horizontal axis, and the first stage output signal $V_I$ at the node 138 is represented on the vertical axis. As indicated in FIG. 14-1, the transfer function may be divided into attenuation, gain, and voltage limiting regions. In the attenuation region, the tangential slope at any point is less than 1, while in the gain region it is always greater than 1. In the voltage limiting region, the tangential slope is also less than 1, but the term "voltage limiting region" is used due to the clipping of large input voltages that fall into this region.

Initially, the first stage 104A is biased at the point A in the gain region shown in FIG. 14-1, which allows startup of the oscillator from ambient noise. As the oscillation grows and forms into pulses, the first stage output signal $V_I$ eventually begins to clip, as discussed above in connection with FIG. 13. As a result, the amplifier bias voltage $V_{bias}$ begins to fall until a steady-state bias is reached at the point B, as indicated by the dashed line between the points A and B along the transfer function. This adaptive bias control technique facilitates distortion reduction, perturbation rejection, and single mode selection.

More specifically, at the steady-state bias point B shown in FIG. 14-1, the bias point has been sufficiently reduced so that the peak portion of the input and output pulses do not go into the voltage limiting region of the amplifier transfer curve, thereby preventing significant signal distortion. Moreover, small perturbations at the input 108 of the amplifier are attenuated since they fall in the attenuation the region of the transfer function (since the bias point B itself falls into the attenuation region). The higher portions of the input signal lying in the gain region still receive enough gain to compensate loss, however.

Single mode selection also is made possible by the adaptive bias technique described above. Since a higher order mode has a higher DC component and correspondingly a lower steady-state bias point due to the adaptive bias control, the higher mode receives a lower gain overall. In general, only those modes with sufficient gain to overcome the loss of the system can be sustained in steady-state oscillations. When more than one mode has sufficient gain, only the highest order mode is stable, since any small perturbation to a lower mode will grow into a soliton resulting in a higher mode oscillation. Consequently, the mode-dependent gain allows only one soliton pulse train mode to propagate in the oscillator; namely, the highest order mode with sufficient gain to overcome system losses.

In sum, at the output node 138 of the first stage 104A, an automatic gain-adjusted soliton-like pulse is provided, albeit in an inverted form from the signal applied to the input 108 of the first stage. Accordingly, with reference again to FIG. 9, to complete the amplification process, this signal at the node 138 must be inverted in the second stage 104B, which then provides an appropriately amplified oscillator signal at the output 106 shown in FIG. 9.

Figure 15:
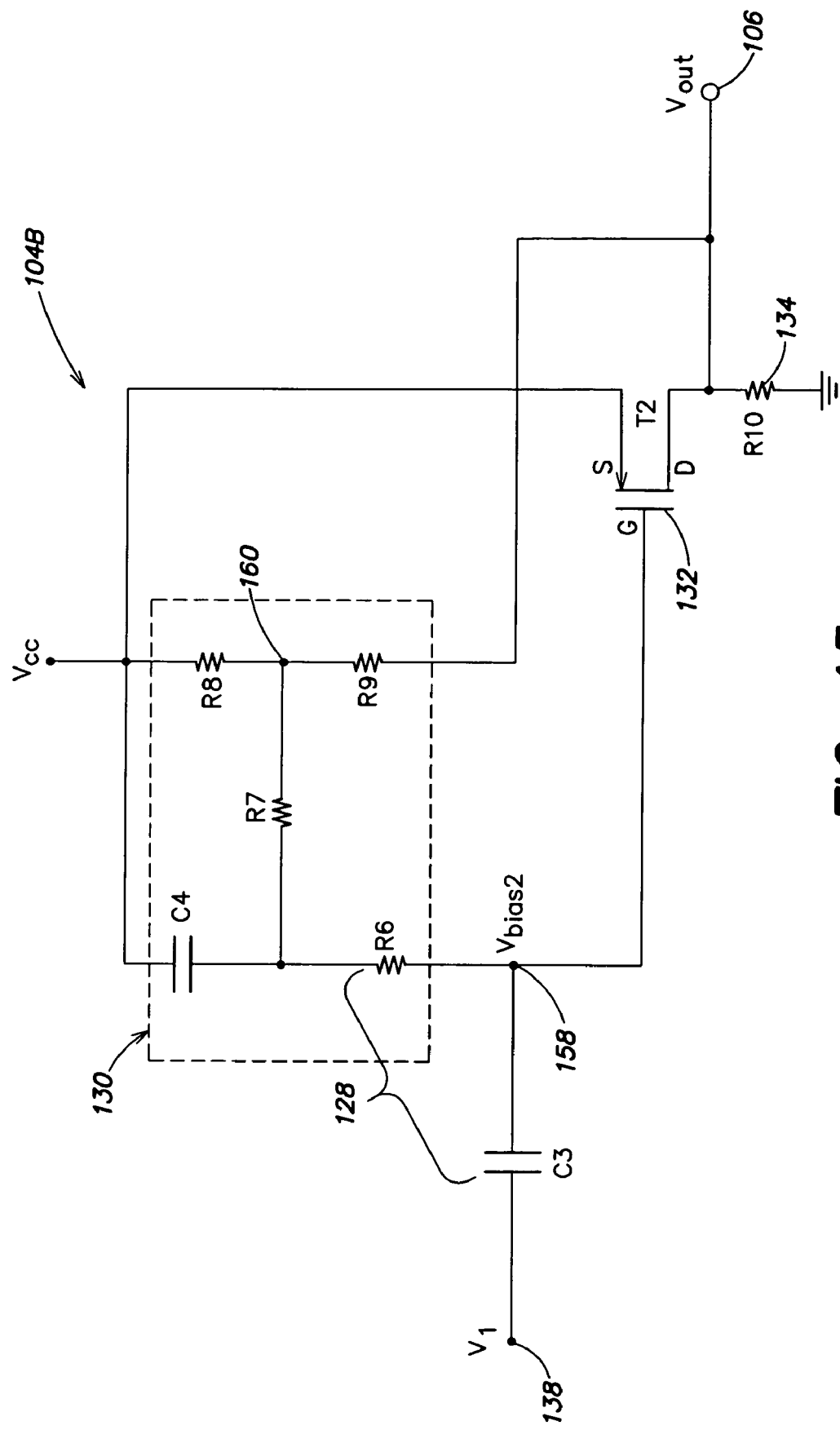
FIG. 15 is a circuit diagram illustrating circuit details of an exemplary second stage of the nonlinear amplifier/filter apparatus of FIG. 9, according to one embodiment of the disclosure.

FIG. 15 is a circuit diagram illustrating circuit details of an exemplary second stage 104B of the nonlinear amplifier/ filter apparatus of FIG. 9, according to one embodiment of the disclosure. In terms of qualitative functionality, the circuit of FIG. 15 is significantly similar to that shown in FIG. 10; however, as discussed further below, from a signal polarity viewpoint, the overall functionality of the second stage 104B is essentially complimentary to that of the first stage 104A. This may be observed generally in the circuit of FIG. 15 in the arrangement of components relative to the supply voltage $V_{CC}$ and the ground potential.

In the circuit diagram of FIG. 15, the signal entering the second stage 104B at the node 138 has a DC component from the amplification process in the first stage 104A; accordingly, as in the first stage, the signal entering the second stage needs to be AC coupled to the amplifying circuitry of the second stage. To this end, the capacitor C3 and resistive components of the circuitry 130 (e.g., R6) essentially form the second high pass filter 128 to provide the required AC coupling. The signal passing through the filter 128 is appropriately biased at a level $V_{bias2}$ at the node 158 by the second bias adjust circuitry 130 in a manner similar to that discussed above in connection with the first bias adjust circuitry; namely, the second bias adjust circuitry 130 is configured to dynamically vary the bias voltage $V_{bias2}$ (which is applied to the transistor T2 as $V_{GS}$) to not only automatically adjust the gain of the second amplifier stage in a predetermined manner based on a desired output amplitude at the amplifier output 106, but also to intentionally "distort" the filtered signal so as to remove any artifacts (e.g., a "tail hump") resulting from the second high pass filter 128 (thereby maintaining a more soliton-like waveform for propagation in the oscillator).

In FIG. 15, the filtered and appropriately biased signal at the node 158 is then applied to the second amplifier 132, which is implemented by PMOS transistor T2. The second load 134 is implemented as a simple resistor R10 (or alternatively an active load, as discussed above). A second feedback signal 160 for the second bias adjust circuitry 130 is derived from the amplified signal provided at the output 106 via the voltage divider formed by resistors R8 and R9. This second feedback signal 160 is averaged by the low pass filter formed by resistor R7 and capacitor C4 to provide the bias voltage $V_{bias2}$.

In one exemplary implementation of the first and second stages respectively shown in FIGS. 10 and 15, the first stage is configured to primarily determine the overall gain and frequency response characteristics of the nonlinear amplifier/filtering apparatus 104, whereas the second stage is configured primarily to merely provide the required signal inversion in the apparatus 104. To this end, whereas the cutoff frequency of the first high pass filter 120 may be particularly selected as discussed above to facilitate single mode oscillation and essentially prevent soliton collisions, the cutoff frequency of the second high pass filter 128 may alternatively be selected to be relatively lower than the cutoff frequency of the first high pass filter, so as to reduce the artifacts resulting from high pass filtering in the second stage (refer again to FIGS. 11A and 11B for the effect of cutoff frequency). Likewise, whereas the range of gain provided by the first amplifier 124 may be selected to primarily determine the overall gain of the nonlinear amplifier/filtering apparatus 104, the range of gain provided by the second amplifier 132 may be relatively lower than the first amplifier, functioning essentially as a "follower" to the first stage (i.e., the first stage may be configured with a gain of from 2 to 3, whereas the second stage may be configured with a gain of from 1 to 2. Of course, it should be appreciated that the foregoing discussion may apply vice versa; namely, that the second stage may be configured to primarily determine the overall gain and frequency response characteristics of the nonlinear amplifier/filtering apparatus 104, whereas the first stage may be configured primarily to merely provide the required signal inversion in the apparatus 104.

Figure 16:
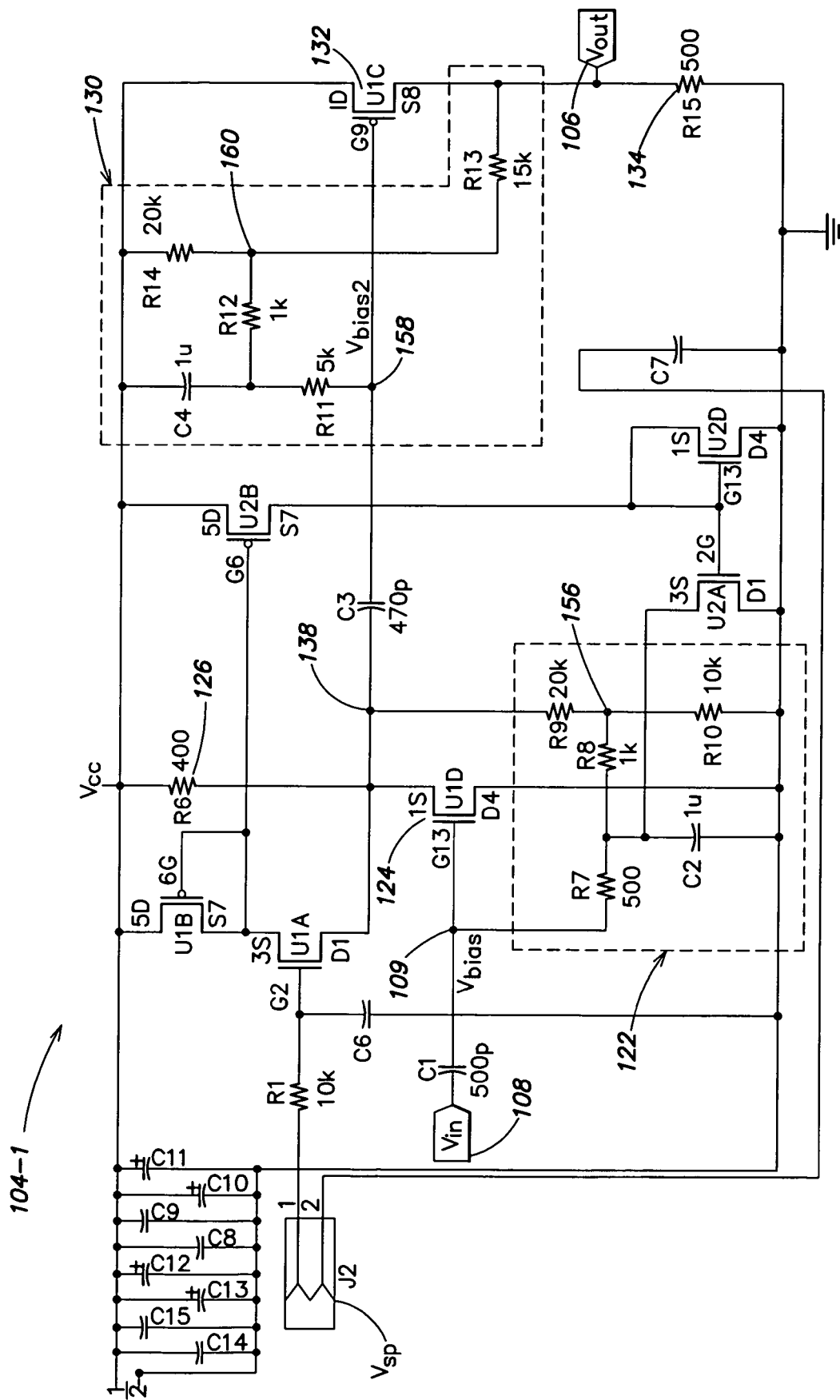
FIG. 16 is a circuit diagram illustrating circuit details of first and second stages of a nonlinear amplifier/filter apparatus similar to that shown in FIG. 9, with additional circuitry to facilitate automatic gain control, according to one embodiment of the disclosure.

FIG. 16 is a circuit diagram illustrating circuit details of first and second stages of a nonlinear amplifier/filter apparatus 104-1 similar to that shown in FIG. 9, with additional circuitry to facilitate adaptive bias control, according to one embodiment of the disclosure. In this embodiment, transistors U1A, U2A, U2D, U2B, U1B provide for an additional bias reduction in some circumstances (e.g., for large signals in which significant clipping may result). The additional bias reduction accomplished by the circuit of FIG. 16 is controlled via a set point voltage $V_{sp}$ applied at an input J2 shown in the left of FIG. 16. In various implementations, this set point voltage $V_{sp}$ may be fixed or variable (e.g., controllable by a user).

In the circuit of FIG. 16, the set point voltage $V_{sp}$ applied at the input J2 biases transistor U1A. The drain of U1A is coupled to the first stage transistor amplifier 124 (U1D in FIG. 16) at the node 138, i.e., the output of the first stage, so as to "sample" the signal at this point. When the voltage at the node 138 falls below the quantity represented by the difference between the set point voltage $V_{sp}$ and the threshold voltage of transistor U1A (i.e., $V_{sp}$-$V_{th}$(U1A)), transistor U1A turns on (i.e., begins to conduct), and current is diverted from the node 138 through U1A and U1B, and mirrored in transistors U2B, U2A and U2D. A flow of current through transistor U2A in this manner draws current from the capacitor C2, which in turn effectively lowers the bias voltage $V_{bias}$ at the node 109. The bias voltage $V_{bias}$ continues to fall until the output at the node 138 is such that the transistor U1A turns off.

Accordingly, the set point voltage $V_{sp}$ essentially determines a "trigger" point corresponding to signal amplitude at the output of the first stage at which the bias voltage $V_{bias}$ may be reduced in an enhanced manner. Although the additional bias reduction circuitry shown in FIG. 16 applies primarily to the first stage of the amplifier, it should be appreciated that in other embodiments, similar circuitry may be employed alternatively in the second stage of the amplifier, or in both the first and second stages of the amplifier, to facilitate an enhanced adaptive bias control.

Having thus described several illustrative embodiments, it is to be appreciated that various alterations, modifications, and improvements will readily occur to those skilled in the art. Such alterations, modifications, and improvements are intended to be part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Accordingly, the foregoing description and attached drawings are by way of example only, and are not intended to be limiting.

The invention claimed is:

1. An electrical nonlinear pulse oscillator, comprising:
   a nonlinear transmission line; and
   a nonlinear amplifier having an input to accept a first signal and an output to provide a second signal, the nonlinear amplifier coupled to the nonlinear transmission line in a closed loop arrangement, wherein the oscillator is configured to propagate along the nonlinear transmission line at least one nonlinear pulse having a target amplitude, and wherein the nonlinear amplifier automatically amplifies or attenuates the first signal based at least in part on an average voltage of the first signal and/or the second signal.

2. The oscillator of claim 1, wherein the at least one nonlinear pulse significantly resembles a soliton waveform.

3. The oscillator of claim 1, wherein the at least one nonlinear pulse includes a cnoidal wave.

4. The oscillator of claim 1, wherein the nonlinear amplifier includes at least one high pass filter.

5. The oscillator of claim 4, wherein the at least one high pass filter is configured so as to facilitate propagation along the nonlinear transmission line of only nonlinear pulses having essentially the target amplitude.

6. The oscillator of claim 4, wherein a cutoff frequency of the at least one high pass filter is selected so as to significantly impede soliton collisions along the nonlinear transmission line.

7. The oscillator of claim 4, wherein the nonlinear amplifier is configured to be spectrum preserving for nonlinear pulses having an essentially soliton waveform.

8. The oscillator of claim 4, wherein the nonlinear amplifier is configured to have an automatically adjustable nonlinear gain.

9. The oscillator of claim 8, wherein the nonlinear amplifier is configured to have a first gain greater than unity when the at least one nonlinear pulse has an amplitude less than the target amplitude and a second gain less than unity when the at least one nonlinear pulse has an amplitude greater than the target amplitude.

10. The oscillator of claim 9, wherein the nonlinear amplifier is configured to be spectrum preserving for nonlinear pulses having an essentially soliton waveform.

11. The oscillator of claim 4, wherein the nonlinear amplifier is configured to implement an adaptive bias control technique.

12. The oscillator of claim 11, wherein the nonlinear amplifier is configured to have at least one automatically adjustable bias point.

13. The oscillator of claim 4, wherein the nonlinear amplifier is configured to facilitate single mode operation of the oscillator.

14. The oscillator of claim 4, wherein the nonlinear amplifier comprises a first stage and a second stage.

15. The oscillator of claim 14, wherein the nonlinear amplifier includes complimentary NMOS and PMOS components.

16. The oscillator of claim 14, wherein the first stage includes a first high pass filter and the second stage includes a second high pass filter.

17. The oscillator of claim 14, wherein each of the first stage and the second stage includes feedback circuitry to facilitate an automatic adjustment of a bias voltage for the stage.

18. The oscillator of claim 17, wherein the feedback circuitry includes a low pass filter.

19. A method for generating periodic electrical nonlinear pulses, comprising acts of:
A) amplifying or attenuating a first signal in a nonlinear manner to provide a second signal;
B) applying the second signal to a nonlinear transmission line for propagation along the nonlinear transmission line to generate a third signal;
C) repeating the acts A) and B) using the third signal as the first signal; and
D) repeating the acts A), B) and C) such that the third signal develops the periodic nonlinear pulses having a target amplitude, wherein the act A) includes an act of automatically amplifying or attenuating the first signal based at least in part on an average voltage of the first signal and/or the second signal.

20. The method of claim 19, wherein the act A) includes an act of conditioning the first signal such that the periodic nonlinear pulses significantly resemble soliton waveforms.

21. The method of claim 19, wherein the act A) includes an act of high pass filtering the first signal to provide the second signal.

22. The method of claim 21, wherein the act of high pass filtering includes an act of high pass filtering to facilitate propagation along the nonlinear transmission line of only nonlinear pulses having essentially the target amplitude.

23. The method of claim 21, wherein the act of high pass filtering includes an act of attenuating frequencies below a selected cutoff frequency so as to significantly impede soliton collisions along the nonlinear transmission line.

24. The method of claim 21, wherein the act of high pass filtering includes an act of preserving a spectrum of nonlinear pulses having an essentially soliton waveform.

25. The method of claim 19, wherein the act A) includes acts of amplifying the first signal when the first signal and/or the second signal has an average voltage less than a value representing the target amplitude, and attenuating the first signal when the first signal and/or the second signal has an average voltage greater than the value representing the target amplitude.

26. A nonlinear amplifier for generating periodic electrical nonlinear pulses having an essentially soliton waveform, the amplifier comprising:
a first stage to receive an amplifier input signal and provide a first stage output signal, the first stage including at least one first semiconductor amplifying component and first feedback circuitry to facilitate a variable adjustment of a first bias voltage associated with the at least one first semiconductor amplifying component, wherein the first bias voltage is adjusted based at least in part on an average voltage of the first stage output signal; and
a second stage to receive the first stage output signal and provide an amplifier output signal, the second stage including at least one second semiconductor amplifying component and second feedback circuitry to facilitate a variable adjustment of a second bias voltage associated with the at least one second semiconductor amplifying component, wherein the second bias voltage is adjusted based at least in part on an average voltage of the amplifier output signal.

27. The amplifier of claim 26, wherein the first stage and the second stage are configured to be spectrum preserving for the nonlinear pulses having the essentially soliton waveform.

28. The amplifier of claim 26, wherein the first feedback circuitry and the second feedback circuitry are configured such that the amplifier has an automatically adjustable nonlinear gain.

29. The amplifier of claim 28, wherein the first feedback circuitry includes at least one first low pass filter and wherein the second feedback circuitry includes at least one second low pass filter to facilitate a gradual adjustment of the automatically adjustable nonlinear gain.

30. The amplifier of claim 26, wherein the at least one first semiconductor amplifying component and the at least one second semiconductor amplifying component are complementary components.

31. The amplifier of claim 30, wherein the at least one first semiconductor amplifying component includes at least one NMOS component, and wherein the at least one second semiconductor amplifying component includes at least one PMOS component.

32. The amplifier of claim 26, wherein the first stage includes a first high pass filter and the second stage includes a second high pass filter.

33. The amplifier of claim 32, wherein at least one of the first high pass filter and the second high pass filter is configured so as to facilitate propagation of only nonlinear pulses having a target amplitude.

34. The amplifier of claim 33, wherein a cutoff frequency of at least one of the first high pass filter and the second high pass filter is selected so as to significantly impede soliton collisions.

35. The amplifier of claim 33, wherein the first stage and the second stage are configured to be spectrum preserving for the nonlinear pulses having the essentially soliton waveform.

* * * * *